US012812955B2

(12) United States Patent
Maruyama

(10) Patent No.: US 12,812,955 B2
(45) Date of Patent: Nov. 24, 2026

(54) SEMICONDUCTOR DEVICE AND METHOD OF MANUFACTURING THE SAME

(71) Applicant: Sumitomo Electric Device Innovations, Inc., Yokohama (JP)

(72) Inventor: Hiroaki Maruyama, Yokohama (JP)

(73) Assignee: SUMITOMO ELECTRIC DEVICE INNOVATIONS, INC., Yokohama (JP)

( * ) Notice: Subject to any disclaimer, the term of this patent is extended or adjusted under 35 U.S.C. 154(b) by 255 days.

(21) Appl. No.: 18/756,781

(22) Filed: Jun. 27, 2024

(65) Prior Publication Data

US 2025/0006809 A1 Jan. 2, 2025

(30) Foreign Application Priority Data

Jun. 30, 2023 (JP) ................................ 2023-108430

(51) Int. Cl.

*H10D 64/27* (2025.01)
*H10D 30/60* (2025.01)
*H10D 64/00* (2025.01)
*H10D 64/23* (2025.01)
*H10D 84/83* (2025.01)

(52) U.S. Cl.

CPC ........... *H10D 64/519* (2025.01); *H10D 30/60* (2025.01); *H10D 64/111* (2025.01); *H10D 64/257* (2025.01); *H10D 84/83* (2025.01)

(58) Field of Classification Search

CPC ....... H10D 30/475; H10D 30/501–509; H10D 30/60; H10D 62/113; H10D 62/124; H10D 62/8503; H10D 62/881; H10D 64/111; H10D 64/254; H10D 64/256–2565; H10D 64/257; H10D 64/512; H10D 64/817; H10D 64/519; H10D 84/83

See application file for complete search history.

(56) References Cited

U.S. PATENT DOCUMENTS

2002/0140024 A1 10/2002 Aoki et al.

FOREIGN PATENT DOCUMENTS

JP 2002-299351 A 10/2002
JP 2022-135899 A 9/2022

*Primary Examiner* — Cheung Lee

(74) *Attorney, Agent, or Firm* — Volpe Koenig

(57) ABSTRACT

A semiconductor device includes a substrate, a first transistor unit having a first drain electrode, a first gate electrode, and a first source electrode, a second transistor unit having a second source electrode, a second gate electrode electrically, and a second drain electrode, a gate wiring provided on the substrate between the first source electrode and the second source electrode and electrically connected to the first gate electrode and the second gate electrode, a first cover metal layer provided above the substrate between the first source electrode and the gate wiring and adjacent to the first source electrode and the gate wiring, and electrically connected to the first source electrode, and a second cover metal layer provided above the substrate between the second source electrode and the gate wiring and adjacent to the second source electrode and the gate wiring, and electrically connected to the second source electrode.

10 Claims, 26 Drawing Sheets

SEMICONDUCTOR DEVICE AND METHOD OF MANUFACTURING THE SAME

CROSS REFERENCE TO RELATED APPLICATIONS

This application claims priority based on Japanese Patent Application No. 2023-108430 filed on Jun. 30, 2023, and the entire contents of the Japanese patent applications are incorporated herein by reference.

FIELD

A certain aspect of the embodiments is related to a semiconductor device and a method for manufacturing the same.

BACKGROUND

In a field effect transistor (FET) having a finger-shaped source electrode, a finger-shaped gate electrode, and a finger-shaped drain electrode, it is known that a plurality of unit FETs each having the source electrode, the gate electrode, and the drain electrode are arranged in an extending direction of the electrodes (for example, Patent Document 1: Japanese Laid-Open Patent Application No. 2002-299351).

SUMMARY

A semiconductor device according to the present disclosure includes: a substrate; a first transistor unit having a first drain electrode, a first gate electrode, and a first source electrode which are provided in order on the substrate; a second transistor unit having a second source electrode arranged along the first source electrode and electrically connected to the first source electrode, a second gate electrode electrically connected to the first gate electrode, and a second drain electrode electrically connected to the first drain electrode, the second source electrode, the second gate electrode and the second drain electrode being provided in order on the substrate, the second transistor unit being located in a direction where the first drain electrode, the first gate electrode, and the first source electrode are arranged with respect to the first transistor unit; a gate wiring provided on the substrate between the first source electrode and the second source electrode and electrically connected to the first gate electrode and the second gate electrode; a first cover metal layer provided above the substrate between the first source electrode and the gate wiring and adjacent to the first source electrode and the gate wiring, and electrically connected to the first source electrode; and a second cover metal layer provided above the substrate between the second source electrode and the gate wiring and adjacent to the second source electrode and the gate wiring, and electrically connected to the second source electrode.

A method of manufacturing a semiconductor device according to the present disclosure includes: forming, on a substrate, a first transistor unit having a first drain electrode, a first gate electrode, and a first source electrode provided in order, and a second transistor unit having a second source electrode provided along the first source electrode and electrically connected to the first source electrode, a second gate electrode electrically connected to the first gate electrode, and a second drain electrode electrically connected to the first drain electrode, the second source electrode, the second gate electrode, and the second drain electrode being provided in order, the second transistor unit being located in a direction where the first drain electrode, the first gate electrode, and the first source electrode are arranged with respect to the first transistor unit; forming a gate wiring on the substrate between the first source electrode and the second source electrode, the gate wiring being electrically connected to the first gate electrode and the second gate electrode; and simultaneously forming a first cover metal layer provided above the substrate between the first source electrode and the gate wiring and adjacent to the first source electrode and the gate wiring and electrically connected to the first source electrode, a second cover metal layer provided above the substrate between the second source electrode and the gate wiring and adjacent to the second source electrode and the gate wiring and electrically connected to the second source electrode, and a field plate provided above the substrate between the first gate electrode and the first drain electrode.

DETAILED DESCRIPTION OF EMBODIMENTS

Figure 1:
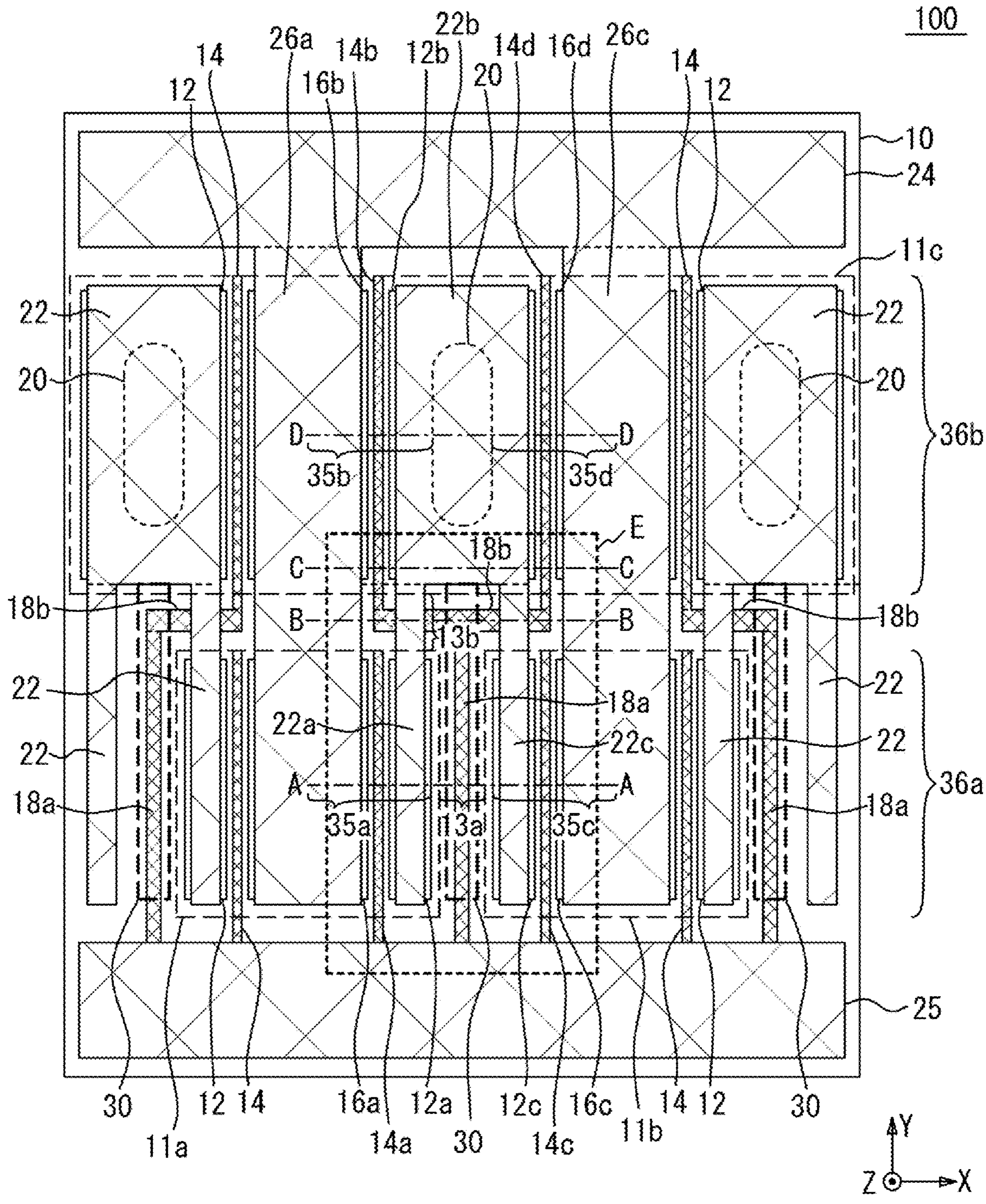
FIG. 1 is a plan view of a semiconductor device according to a first embodiment.

In Patent Document 1, the width of the gate electrode of the unit FET can be shortened by arranging the plurality of the unit FETs in the extending direction of the electrodes. Therefore, a gate resistance can be suppressed. However, a parasitic capacitance between a drain electrode and a gate wiring electrically connecting a gate pad and a gate electrode away from the gate pad increases, and the characteristics deteriorate.

The present disclosure has been made in view of the above problems, and an object thereof is to suppress deterioration of characteristics.

Details of Embodiments of the Present Disclosure

First, the contents of the embodiments of this disclosure are listed and explained.

(1) A semiconductor device according to the present disclosure includes: a substrate; a first transistor unit having a first drain electrode, a first gate electrode, and a first source electrode which are provided in order on the substrate; a second transistor unit having a second source electrode arranged along the first source electrode and electrically connected to the first source electrode, a second gate electrode electrically connected to the first gate electrode, and a second drain electrode electrically connected to the first drain electrode, the second source electrode, the second gate electrode and the second drain electrode being provided in order on the substrate, the second transistor unit being located in a direction where the first drain electrode, the first gate electrode, and the first source electrode are arranged with respect to the first transistor unit; a gate wiring provided on the substrate between the first source electrode and the second source electrode and electrically connected to the first gate electrode and the second gate electrode; a first cover metal layer provided above the substrate between the first source electrode and the gate wiring and adjacent to the first source electrode and the gate wiring, and electrically connected to the first source electrode; and a second cover metal layer provided above the substrate between the second source electrode and the gate wiring and adjacent to the second source electrode and the gate wiring, and electrically connected to the second source electrode. This makes it possible to suppress a gate-drain parasitic capacitance and to suppress the deterioration of characteristics.

(2) In the above (1), at least a part of the first cover metal layer and at least a part of the second cover metal layer may overlap with the gate wiring in a non-contact manner in plan view. This makes it possible to further suppress the gate-drain parasitic capacitance and to further suppress the deterioration of the characteristics.

(3) In the above (1) or (2), the first cover metal layer and the second cover metal layer may be in contact with each other above the gate wiring. This makes it possible to further suppress the gate-drain parasitic capacitance and to further suppress the deterioration of the characteristics.

(4) In the above (3), the first cover metal layer and the second cover metal layer may not be in contact with each other above the gate wiring. This makes it possible to suppress a gate-source parasitic capacitance and further suppress the deterioration of the characteristics.

(5) In the above (4), an end of the first cover metal layer may overlap with the gate wiring in plan view, and an end of the second cover metal layer may overlap with the gate wiring in the plan view. This makes it possible to suppress the gate-drain parasitic capacitance and the gate-source parasitic capacitance and to further suppress the deterioration of the characteristics.

(6) In any one of the above (1) to (5), a height of an upper surface of the first cover metal layer from the substrate may be larger than a height of an upper surface of the gate wiring from the substrate, and a height of a lower surface of the first cover metal layer located outside the gate wiring from the substrate may be smaller than the height of the upper surface of the gate wiring from the substrate. This makes it possible to further suppress the gate-drain parasitic capacitance and to further suppress the deterioration of the characteristics.

(7) In any one of the above (1) to (6), the semiconductor device further may include a source wiring provided on the first source electrode in electrical contact therewith. A height of an upper surface of the first cover metal layer from the substrate may be smaller than a height of an upper surface of the source wiring from the substrate. This makes it possible to suppress the gate-drain parasitic capacitance and the gate-source parasitic capacitance, and to further suppress the deterioration of the characteristics.

(8) In any one of the above (1) to (7), the semiconductor device further may include a field plate provided above the substrate between the first gate electrode and the first drain electrode. The field plate may be formed of a same material as the first cover metal layer. This can reduce the number of manufacturing steps for forming the cover metal layer.

(9) In any one of the above (1) to (8), the semiconductor device further may include a third transistor unit having a third drain electrode electrically connected to the first drain electrode, a third gate electrode electrically connected to the gate wiring, and a third source electrode electrically connected to the first source electrode, the third drain electrode, the third gate electrode and the third source electrode being provided in order on the substrate, the third transistor unit being located in a direction where the first gate electrode extends with respect to the first transistor unit. This makes it possible to further suppress the gate-drain parasitic capacitance and to further suppress the deterioration of the characteristics.

(10) A method of manufacturing a semiconductor device according to the present disclosure includes: forming, on a substrate, a first transistor unit having a first drain electrode, a first gate electrode, and a first source electrode provided in order, and a second transistor unit having a second source electrode provided along the first source electrode and electrically connected to the first source electrode, a second gate electrode electrically connected to the first gate electrode, and a second drain electrode electrically connected to the first drain electrode, the second source electrode, the second gate electrode, and the second drain electrode being provided in order, the second transistor unit being located in a direction where the first drain electrode, the first gate electrode, and the first source electrode are arranged with respect to the first transistor unit; forming a gate wiring on the substrate between the first source electrode and the second source electrode, the gate wiring being electrically connected to the first gate electrode and the second gate electrode; and simultaneously forming a first cover metal layer provided above the substrate between the first source electrode and the gate wiring and adjacent to the first source electrode and the gate wiring and electrically connected to the first source electrode, a second cover metal layer provided above the substrate between the second source electrode and the gate wiring and adjacent to the second source electrode and the gate wiring and electrically connected to the second source electrode, and a field plate provided above the substrate between the first gate electrode and the first drain electrode. This makes it possible to suppress the deterioration of the characteristics and to reduce the number of manufacturing steps for forming the cover metal layer.

Specific examples of a semiconductor device and a method for manufacturing the same according to embodiments of the present disclosure will be described below with reference to the drawings. It should be noted that the present disclosure is not limited to these examples, but is defined by the claims and is intended to include all modifications within the meaning and scope equivalent to the claims.

First Embodiment

Figure 2:
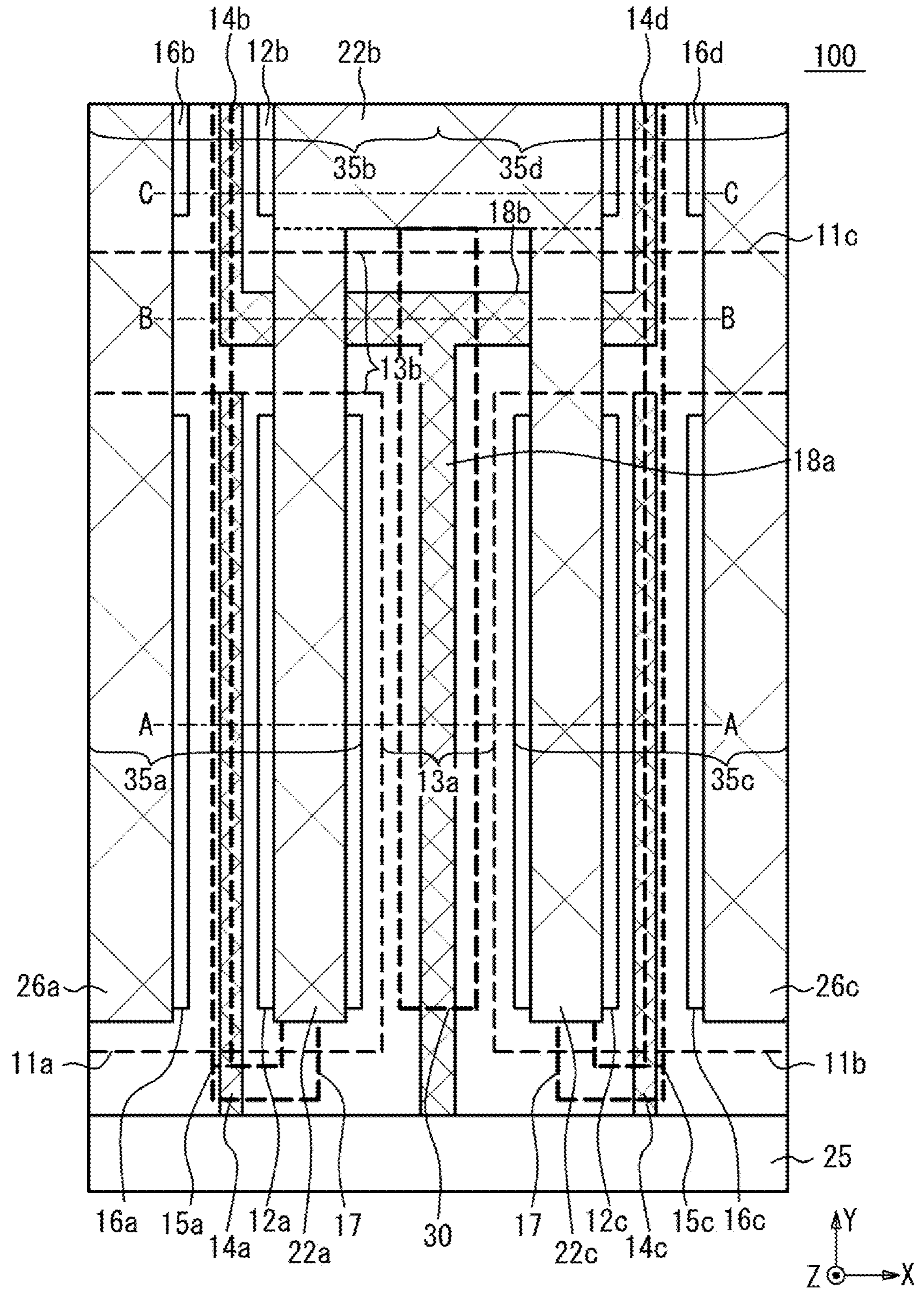
FIG. 2 is an enlarged view of a range E of FIG. 1.

A description will be given of a semiconductor device used in an amplifier for amplifying a high frequency signal of, for example, 0.5 GHz to 10 GHz in a base station of mobile communication as an example. FIG. 1 is a plan view of a semiconductor device according to a first embodiment. FIG. 2 is an enlarged view of a range E in FIG. 1, and FIGS. 3 to 5 are cross-sectional views taken along lines A-A, B-B, C-C and D-D of FIG. 1 or FIG. 2, respectively. A thickness direction of a substrate 10 is defined as a Z direction, an extending direction of finger-shaped electrodes is defined as a Y direction (first direction), and an arrangement direction of the electrodes is defined as an X direction (second direction intersecting the first direction). In FIG. 1, field plates 15*a* and 15*c* are not illustrated for the sake of simplicity.

In each figure, a source electrode 12, a gate electrode 14, a source wiring 22 and a unit FET 35 represent general elements. Source electrodes 12*a* to 12*c*, gate electrodes 14*a* to 14*d*, source wirings 22*a* to 22*c* and unit FETs 35*a* to 35*d* represent specific elements included in the general elements. In the following, the unit FETs 35*a* to 35*d* will be mainly described by using the source electrodes 12*a* to 12*c*, the gate electrodes 14*a* to 14*d*, drain electrodes 16*a* and 16*b*, the source wirings 22*a* to 22*c*, and drain wirings 26*a* and 26*c*.

As illustrated in FIGS. 1 to 6, in a semiconductor device 100 of the first embodiment, the substrate 10 includes a substrate 10*a* and a semiconductor layer 10*b* provided on the substrate 10*a*. In an XY plane parallel to the X direction and the Y direction, regions of the semiconductor layer 10*b* deactivated by ion implantation or the like are inactive regions 13*a* and 13*b*, and regions not inactivated are active regions 11*a* to 11*c*.

The active regions 11*a* and 11*b* are arranged in the X direction. The active region 11*c* is provided in a region in the + direction of the Y direction away from the active regions 11*a* and 11*b*. A region between the active regions 11*a* and 11*b* is the inactive region 13*a*. A region between the active region 11*c* and the active regions 11*a* and 11*b* is the inactive region 13*b*. An FET group 36*a* including the plurality of unit FETs 35*a* and 35*c* arranged in the X direction is provided on the active regions 11*a* and 11*b*. An FET group 36*b* including the plurality of unit FETs 35*b* and 35*d* arranged in the X direction is provided on the active region 11*c*. A gate bus bar 25 and the FET group 36*b* interpose the FET group 36*a*. A drain bus bar 24 and the FET group 36*a* interpose the FET group 36*b*.

The unit FET 35*a* (first transistor unit) has the source electrode 12*a* (first source electrode), the gate electrode 14*a* (first gate electrode), and the drain electrode 16*a* (first drain electrode), which extend in the Y direction and are provided on the substrate 10. The drain electrode 16*a*, the gate electrode 14*a* and the source electrode 12*a* are provided in this order in the X direction. The unit FET 35*c* (second transistor unit) is located in a direction in which the drain electrode 16*a*, the gate electrode 14*a*, and the source electrode 12*a* are arranged with respect to the unit EET 35*a*. The unit FET 35*c* has the source electrode 12*c* (second source electrode), the gate electrode 14*c* (second gate electrode), and a drain electrode 16*c* (second drain electrode), which are respectively extended in the Y direction and provided on the substrate 10. The source electrode 12*c*, the gate electrode 14*c* and the drain electrode 16*c* are provided in this order in the X direction. The source electrode 12*c* is provided along and parallel to the source electrode 12*a* and electrically connected to the source electrode 12*a* via the source electrode 12*b*. The gate electrode 14*c* is electrically connected to the gate electrode 14*a* via the gate bus bar 25. The drain electrode 16*c* is electrically connected to the drain electrode 16*a* via the drain bus bar 24.

The field plate 15*a* is provided on the substrate 10 between the gate electrode 14*a* and the drain electrode 16*a*, and between the gate electrode 14*b* and the drain electrode 16*b*, and an insulating layer 32*a* is interposed between the field plate 15*a* and the substrate 10. The field plate 15*c* is provided on the substrate 10 between the gate electrode 14*c* and the drain electrode 16*c*, and between the gate electrode 14*d* and a drain electrode 16*d*, and the insulating layer 32*a* is interposed between the field plate 15*c* and the substrate 10. At least a part of the field plate 15*a* may or may not overlap with the gate electrodes 14*a* and 14*b* when viewed in the Z direction. At least a part of the field plate 15*c* may or may not overlap with the gate electrodes 14*c* and 14*d* when viewed in the Z direction. The field plates 15*a* and 15*c* are electrically connected are short-circuited to the source wirings 22*a* and 22*c* through wirings 17, respectively. The field plates 15*a* and 15*c* are provided for improving a drain breakdown voltage and suppressing a gate-drain parasitic capacitance. The field plates 15*a* and 15*c* may not be provided.

A gate wiring 18*a* extending in the Y direction is provided on a region of the substrate 10 located in the +X direction of the unit FET 35*a*. The gate wiring 18*a* is provided on the inactive region 13*a* between the unit FETs 35*a* and 35*c*. That is, in the unit FET 35*a*, the source electrode 12*a* is closer to the gate wiring 18*a* than the drain electrode 16*a*. In the unit FET 35*c*, the source electrode 12*c* is closer to the gate wiring 18*a* than the drain electrode 16*c*.

The unit FETs 35*b* (third transistor units) and 35*d* are provided in regions on the substrate 10 located in a direction in which the gate electrode 14*a* extends with respect to the unit FETs 35*a* and 35*c*, respectively. The unit FET 35*b* has the source electrode 12*b* (third source electrode), the gate electrode 14*b* (third gate electrode), and the drain electrode 16*b* (third drain electrode), which are respectively extended in the Y direction and provided on the substrate 10. The drain electrode 16*b*, the gate electrode 14*b* and the source electrode 12*b* are provided in this order in the X direction. The drain electrode 16*b* is electrically connected to the drain electrode 16*a*. The gate electrode 14*b* is electrically connected to the gate wiring 18*a*. The unit FET 35*d* has the source electrode 12*b*, the gate electrode 14*d*, and the drain electrode 16*d*, which extend in the Y direction and are provided on the substrate 10. The unit FETs 35*b* and 35*d* share the source electrode 12*b*. When viewed from the Y direction, the source electrodes 12*a* and 12*c* and the gate wiring 18*a* are provided so as to overlap with the source electrode 12*b* and to be included within a range where the source electrode 12*b* is provided.

A gate wiring 18*b* extending in the X direction is provided on the inactive region 13*b*. The gate wiring 18*b* electrically connects and short-circuits the gate wiring 18*a* to the gate electrodes 14*b* and 14*d*. The gate wiring 18*a* and the gate electrodes 14*a* and 14*c* are connected to the gate bus bar 25.

Figure 5:
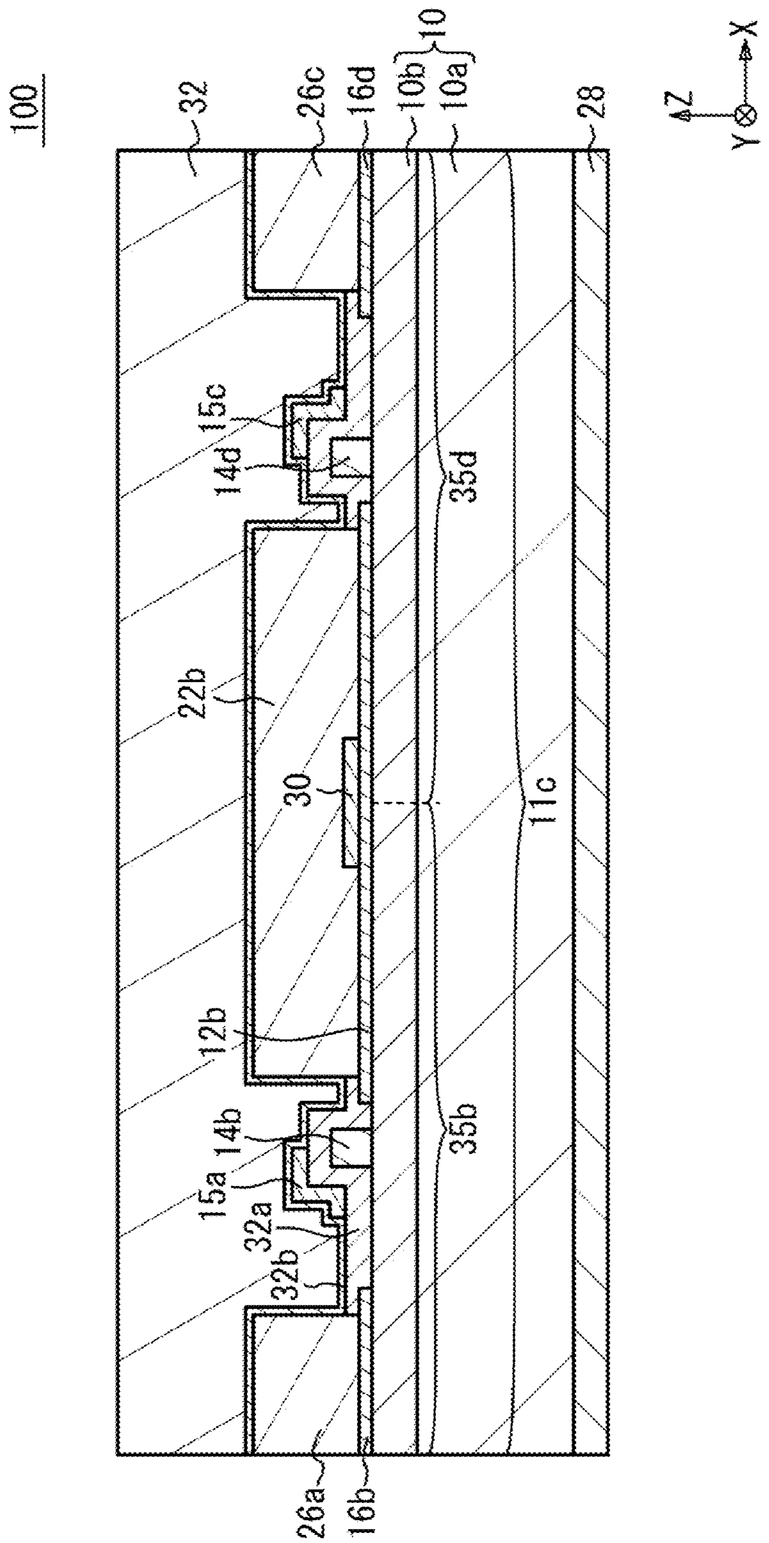
FIG. 5 is a cross-sectional view taken along a line C-C of FIGS. 1 and 2.
Figure 6:
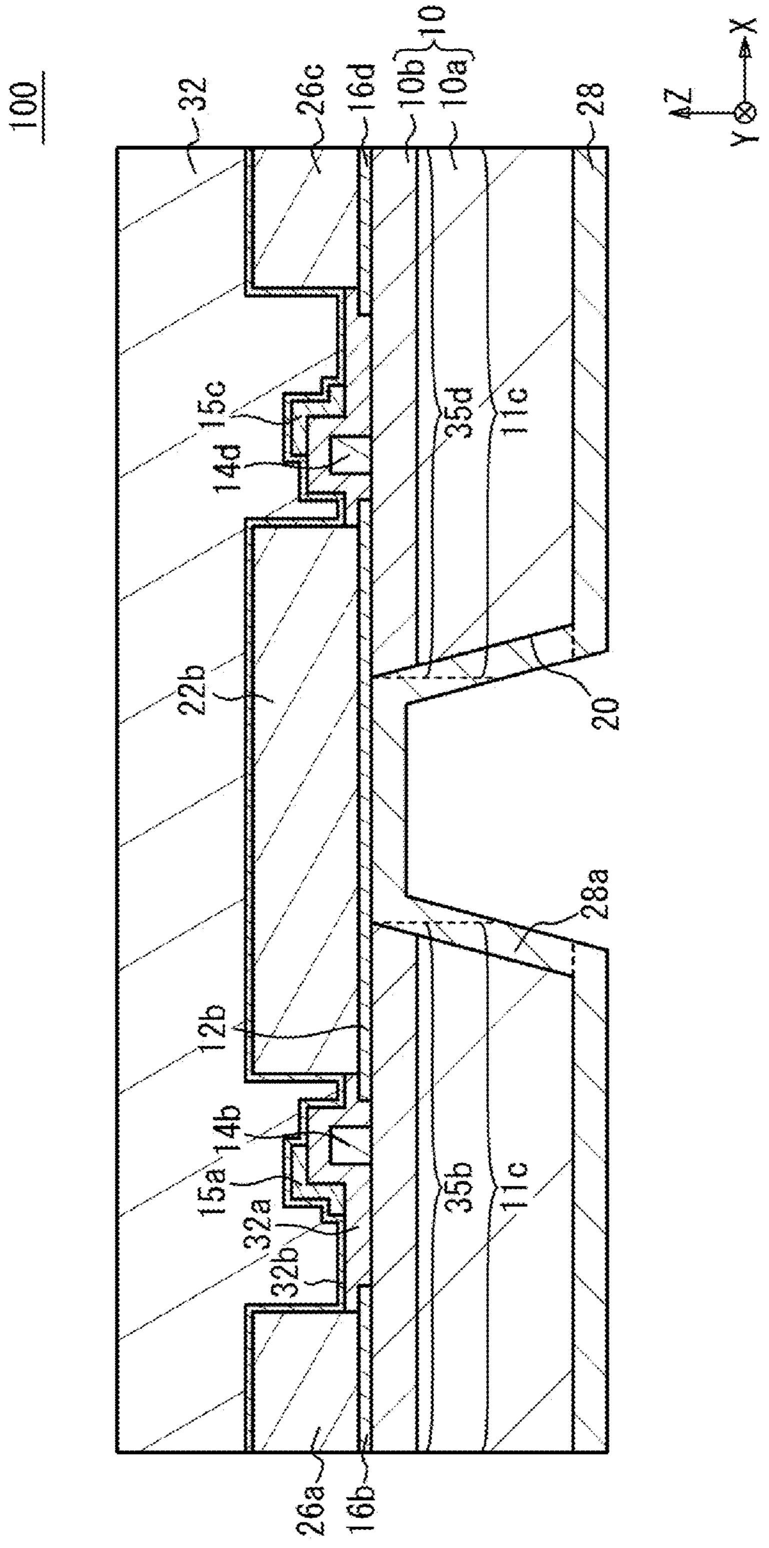
FIG. 6 is a cross-sectional view taken along a line D-D of FIG. 1.

A cover metal layer 30 is provided so as to cover the gate wiring 18*a* with the insulating layer 32*a* interposed therebetween. The width of the cover metal layer 30 in the X direction is larger than the width of the gate wiring 18*a* in the X direction. As illustrated in FIG. 5, the cover metal layer 30 is interposed between the source electrode 12*b* and the source wiring 22*b*, whereby the cover metal layer 30 is electrically connected and short-circuited to the source electrode 12*b* and the source wiring 22*b*. The cover metal layer 30 may be connected to the source wirings 22*a* and 22*c*. In this way, the cover metal layer 30 is connected to the source wirings 22*a* to 22*c* at one or more positions.

The source wirings 22*a* (first source wirings), 22*b* and 22*c* (second source wirings) are provided on the source electrodes 12*a*, 12*b* and 12*c* in contact therewith, respectively. The source wirings 22*a* and 22*c* interpose the gate wiring 18*b* and the insulating layer 32*a*, and intersect with the gate wiring 18*b* and the insulating layer 32*a* in a non-contact manner, and are connected to the source electrode 12*b*. The drain wiring 26*a* (first drain wiring) is provided on the drain electrodes 16*a* and 16*b* in contact therewith, and electrically connects the drain electrodes 16*a* and 16*b* to the drain bus bar 24. The drain wiring 26*c* (second drain wiring) is provided on the drain electrodes 16*c* and 16*d* in contact therewith, and electrically connects the drain electrodes 16*c* and 16*d* to the drain bus bar 24.

Via holes 20 penetrate the substrate 10 and are connected to the source electrode 12*b*. A metal layer 28 is provided on the lower surface of the substrate 10. A metal layer 28*a* is provided on the inner surface of the via hole 20. As a result, the metal layer 28 is electrically connected and short-circuited to the source electrode 12*b* through the via hole 20.

A source potential (for example, a reference potential such as a ground potential) is supplied from the metal layer 28 to the source electrode 12*b* through the metal layer 28*a* in the via hole 20. Further, the source potential is supplied to the source electrodes 12*a* to 12*c*, the field plates 15*a* and 15*c*, and the cover metal layer 30 through the source wirings 22*a* to 22*c*. A gate potential (e.g., a high frequency signal and a gate bias voltage) is supplied from the gate bus bar 25 to the gate electrodes 14*a* and 14*c*. The gate potential is supplied from the gate bus bar 25 to the gate electrodes 14*b* and 14*d* through the gate wirings 18*a* and 18*b*. A drain bias voltage is supplied from the drain bus bar 24 to the drain electrodes 16*a* to 16*d* through the drain wirings 26*a* and 26*c*. High frequency signals amplified in the respective unit FETs 35*a* to 35*d* are output from the drain wirings 26*a* and 26*c* to the drain bus bar 24.

In the unit FETs 35*a* and 35*c*, the high frequency signals are input from the − ends of the gate electrodes 14*a* and 14*c* in the Y direction. In the unit FETs 35*b* and 35*d*, the high frequency signals are input from the − ends of the gate electrodes 14*b* and 14*d* in the Y direction. When the high frequency signals are inputted to the gate electrodes 14*a* and 14*c* from both ends of the + end and the − end of the gate electrodes 14*a* and 14*c* in the Y direction, the high frequency characteristics of the unit FETs 35*a* and 35*c* are deteriorated due to the phase difference or the like. In the first embodiment, since the + ends of the gate electrodes 14*a* and 14*c* in the Y direction and the − ends of the gate electrodes 14*b* and 14*d* in the Y direction are not connected to each other, the deterioration of the high frequency characteristics of the unit FETs 35*a* and 35*c* can be suppressed.

When the semiconductor device 100 is, for example, a nitride semiconductor device, the substrate 10*a* is, for example, a silicon carbide (SiC) substrate, a silicon (Si) substrate, a gallium nitride (GaN) substrate, or a sapphire ($Al_2O_3$) substrate. The semiconductor layer 10*b* includes a nitride semiconductor layer such as a gallium nitride layer, an aluminum gallium nitride (AlGaN) layer, and/or an indium gallium nitride (InGaN) layer. When the unit FETs 35*a* to 35*d* are GaN HEMTs (Gallium Nitride High Electron Mobility Transistors), the semiconductor layer 10*b* includes a gallium nitride channel layer provided on the substrate 10*a* and an aluminum gallium nitride barrier layer provided on the channel layer. When the semiconductor device 100 is, for example, a gallium arsenide (GaAs)-based semiconductor device, the substrate 10*a* is, for example, a gallium arsenide substrate. The semiconductor layer 10*b* includes an arsenide semiconductor layer, such as a gallium arsenide layer, an aluminum gallium arsenide (AlGaAs) layer and/or an indium gallium arsenide (InGaAs) layer. The semiconductor device 100 may be a silicon semiconductor device such as a LDMOS (Laterally Diffused Metal Oxide Semiconductor).

The source electrodes 12*a* to 12*c* and the drain electrodes 16*a* to 16*d* are metal films, and for example, include a titanium film and an aluminum film stacked on the substrate 10 in this order. The gate electrodes 14*a* to 14*d* and the gate wirings 18*a* and 18*b* are metal films, and for example, include a nickel film and a gold film stacked on the substrate 10 in this order. The field plates 15*a*, 15*c* and the cover metal layer 30 include, for example, a titanium film or a nickel film, and a gold film or an aluminum film, stacked on the insulating layer 32*a* in this order. The source wirings 22*a* to 22*c* and the drain wirings 26*a* and 26*c* are, for example, gold layers, copper layers, or aluminum layers. Each of the insulating layers 32*a* and 32*b* is an inorganic insulating layers such as a silicon nitride layer. An insulating layer 32 is an organic insulating layer such as a polyimide layer or a BCB (Benzocyclobutane) layer.

The widths of the source electrodes 12*a* and 12*c* in the X direction are, for example, 5 μm to 20 μm. The width of the source electrode 12*b* in the X direction is, for example, 50 μm to 150 μm. The gate lengths of the gate electrodes 14*a* to 14*d* in the X direction are, for example, 0.25 μm to 2 μm. The widths of the drain electrodes 16*a* and 16*c* in the X direction are, for example, 5 μm to 150 μm. The width of the gate wiring 18*a* in the X direction is, for example, 5 μm to 20 μm. The width of the gate wiring 18*b* in the Y direction is, for example, 3 μm to 20 μm. The widths of the field plates 15*a* and 15*c* in the X direction are, for example, 1 μm to 10 μm. The width of the cover metal layer 30 in the X direction is, for example, 7 μm to 25 μm. The gate widths of the unit FETs 35*a* to 35*d* in the Y direction are, for example, 100 μm to 400 μm. The width of the via hole 20 in the X direction is, for example, 10 μm to 60 μm.

The widths of the source wirings 22*a* to 22*c* and the drain wirings 26*a* and 26*c* in the X direction are equal to or slightly smaller than the widths of the source electrodes 12*a* to 12*c* and the drain electrodes 16*a* and 16*c* in the X direction, respectively.

The thicknesses of the source wirings 22*a* to 22*c* and the drain wirings 26*a* and 26*c* are, for example, 1 μm to 20 μm. The thicknesses of the field plates 15*a* and 15*c* and the cover metal layer 30 are, for example, 0.5 μm to 1 μm.

Manufacturing Method of First Embodiment

FIGS. 7 to 10 are plan views illustrating a method of manufacturing the semiconductor device according to the first embodiment. FIGS. 11A to 14B are cross-sectional views illustrating a method of manufacturing the semiconductor device according to the first embodiment, and correspond to the A-A cross-section of FIGS. 7 to 10.

Figure 7:
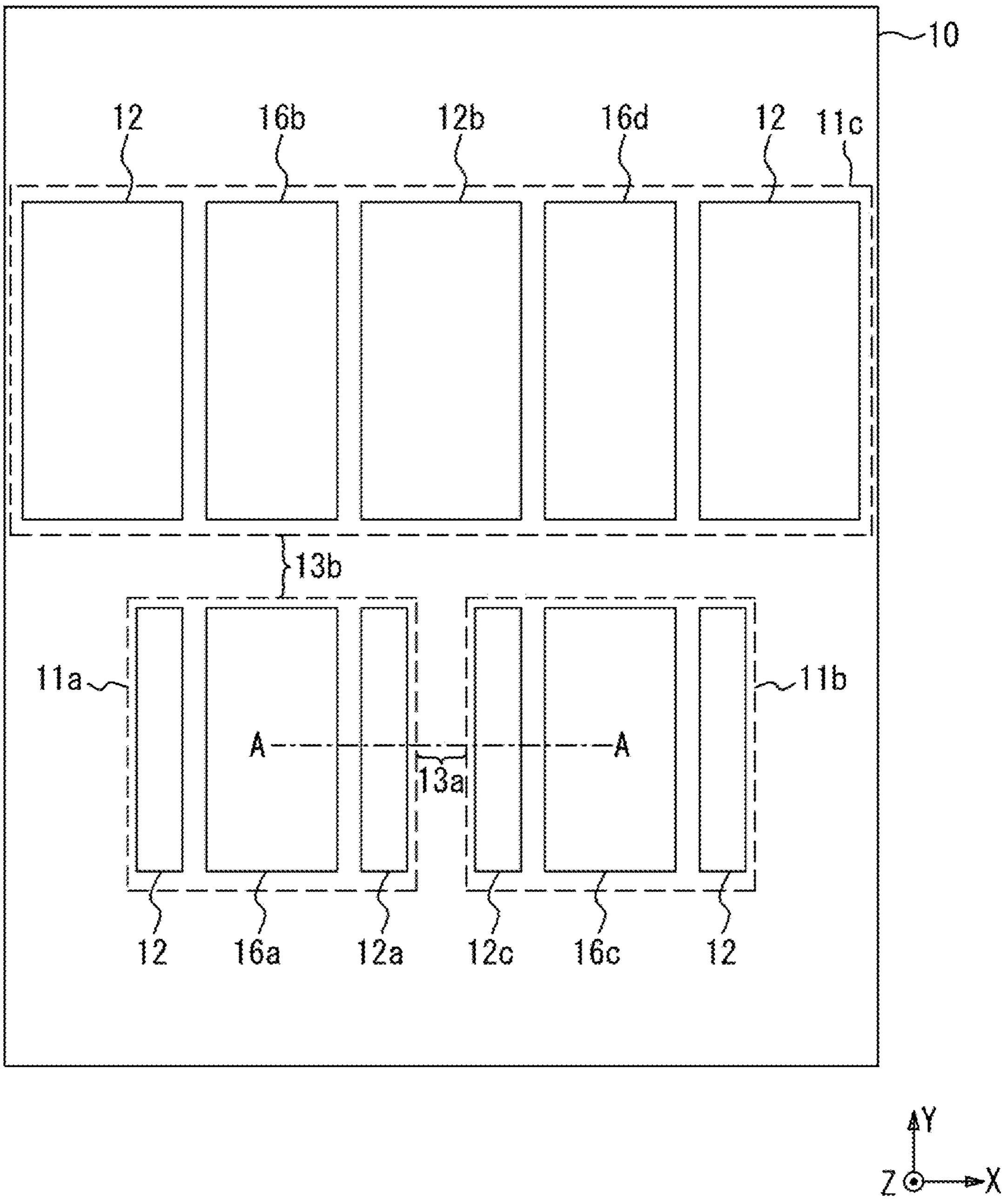
FIG. 7 is a plan view illustrating a method for manufacturing the semiconductor device according to the first embodiment.
Figure 11A:
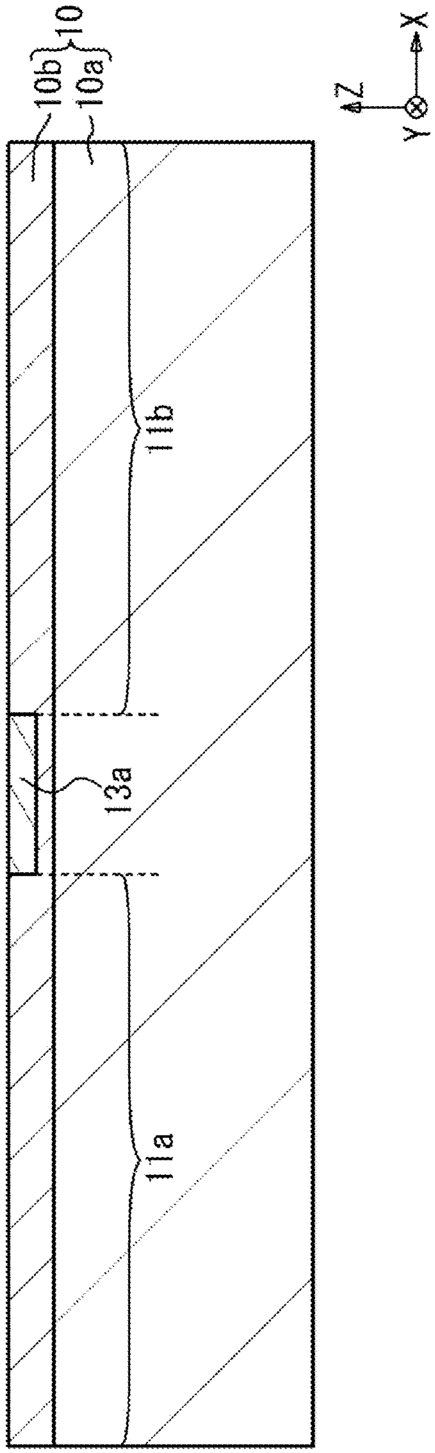
FIG. 11A is a cross-sectional view illustrating the method for manufacturing the semiconductor device according to the first embodiment.

As illustrated in FIGS. 7 and 11A, the semiconductor layer 10*b* is ion-implanted to form the inactive regions 13*a* and 13*b* in the semiconductor layer 10*b*. Regions where the inactive regions 13*a* and 13*b* are not formed are the active regions 11*a* to 11*c*. The inactive region 13*a* is formed between the active regions 11*a* and 11*b*, and the inactive region 13*b* is formed between the active regions 11*a* and 11*b* and the active region 11*c*.

Figure 11B:
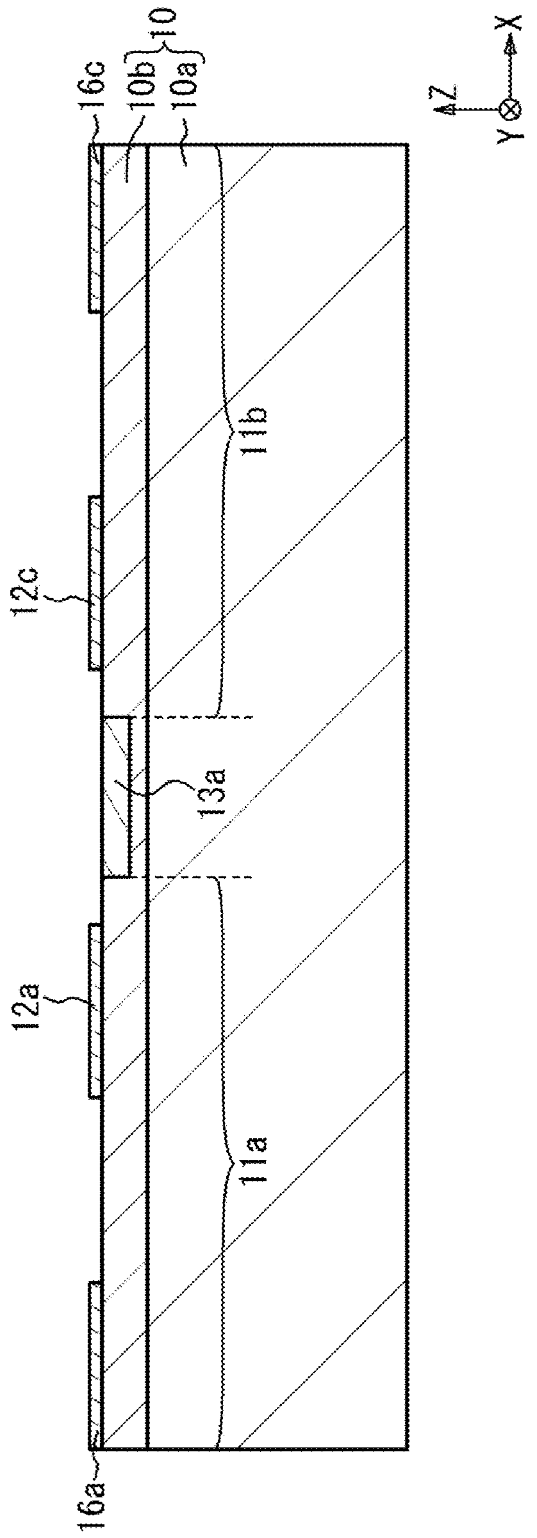
FIG. 11B is a cross-sectional view illustrating the method for manufacturing the semiconductor device according to the first embodiment.

As illustrated in FIGS. 7 and 11B, the source electrode 12*a* and the drain electrode 16*a* are formed on the active region 11*a*. The source electrode 12*c* and the drain electrode 16*c* are formed on the active region 11*b*. The source electrode 12*b* and the drain electrodes 16*b* and 16*d* are formed on the active region 11*c*. The source electrodes 12*a* to 12*c* and the drain electrodes 16*a* to 16*d* are formed by, for example, a vacuum evaporation method and a lift-off method. The resultant structure is then subjected to heat treatment. As a result, the source electrodes 12*a* to 12*c* and the drain electrodes 16*a* to 16*d* are in ohmic contact with the active regions 11*a*, 11*b* and 11*c*.

Figure 8:
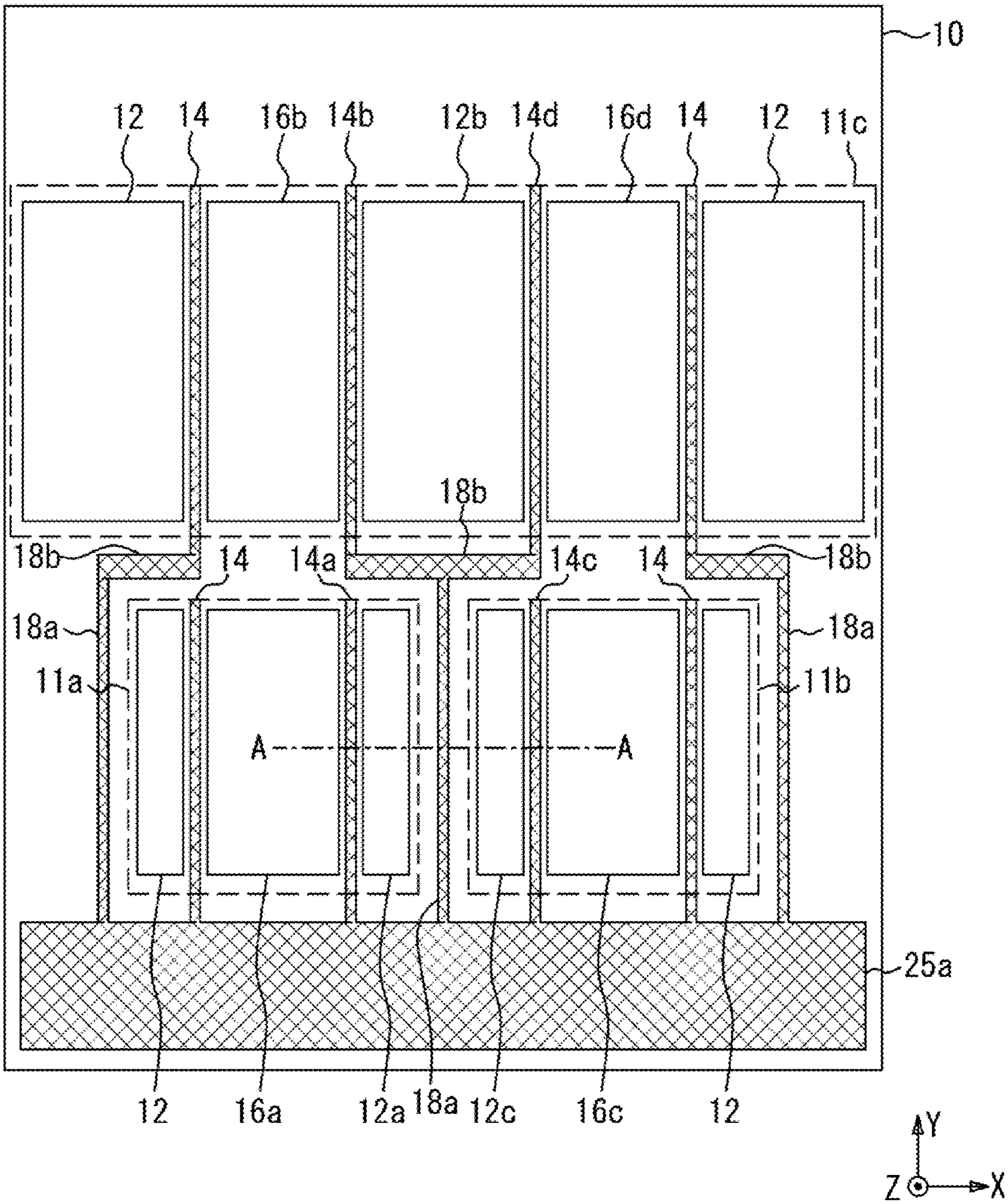
FIG. 8 is a plan view illustrating the method for manufacturing the semiconductor device according to the first embodiment.
Figure 12A:
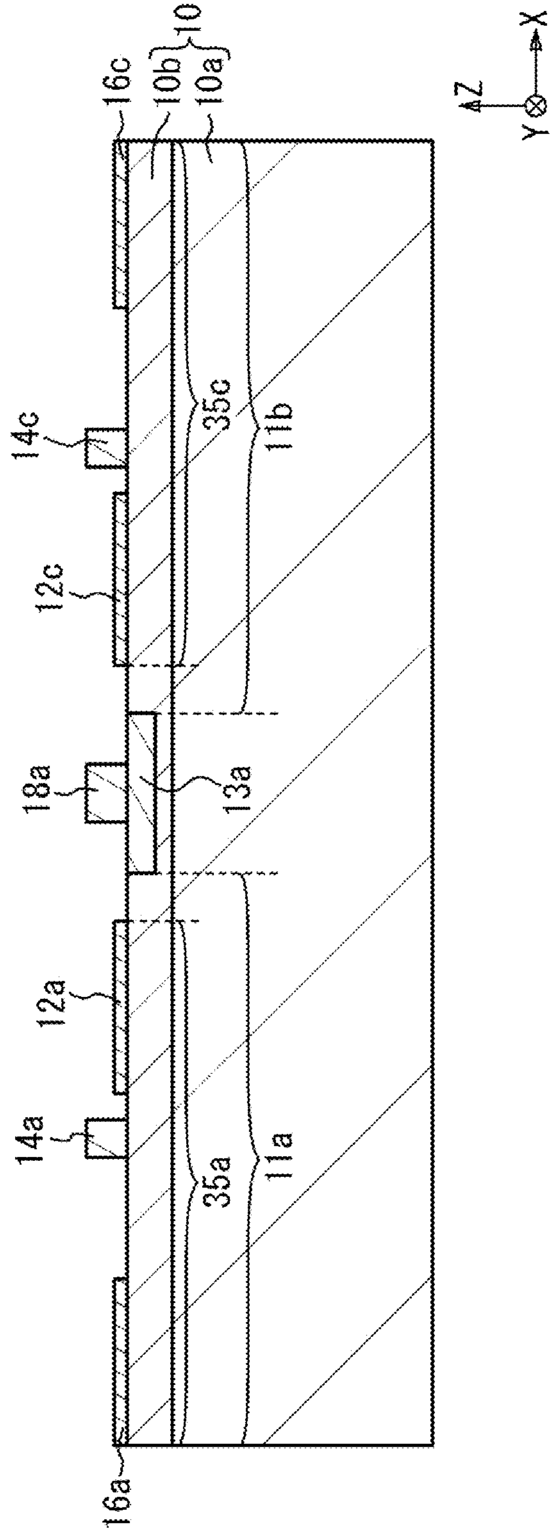
FIG. 12A is a cross-sectional view illustrating the method for manufacturing the semiconductor device according to the first embodiment.

As illustrated in FIGS. 8 and 12A, the gate electrodes 14*a* to 14*d*, the gate wirings 18*a* and 18*b*, and a gate metal layer 25*a* are formed on the substrate 10. The gate electrodes 14*a* to 14*d*, the gate wirings 18*a* and 18*b*, and the gate metal layer 25*a* are formed by, for example, a vacuum evaporation method and a lift-off method.

Figure 12B:
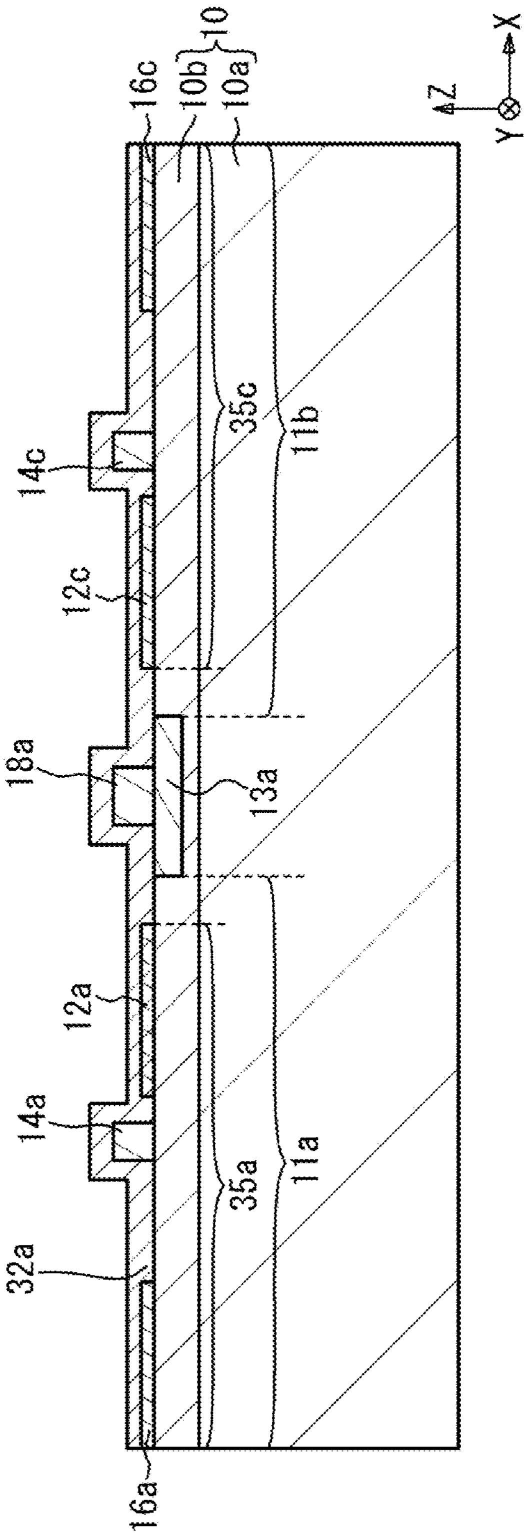
FIG. 12B is a cross-sectional view illustrating the method for manufacturing the semiconductor device according to the first embodiment.

As illustrated in FIG. 12B, the insulating layer 32*a* is formed on the substrate 10 so as to cover the source electrodes 12*a* to 12*c*, the drain electrodes 16*a* and 16*c*, the gate electrodes 14*a* to 14*d*, the gate wirings 18*a* and 18*b*, and the gate metal layer 25*a*. The insulating layer 32*a* is formed by, for example, a CVD (Chemical Vapor Deposition) method.

Figure 9:
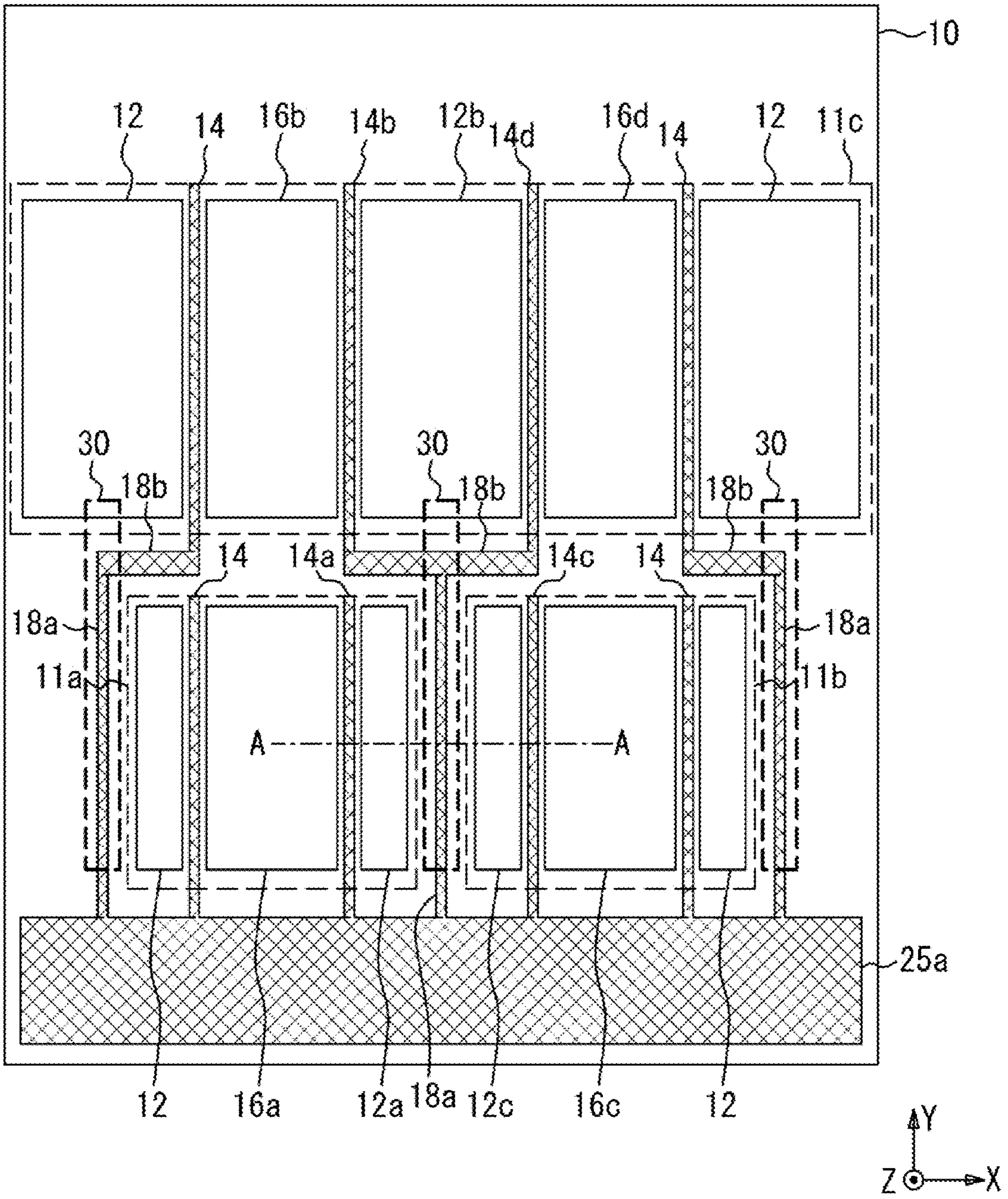
FIG. 9 is a plan view illustrating the method for manufacturing the semiconductor device according to the first embodiment.
Figure 13A:
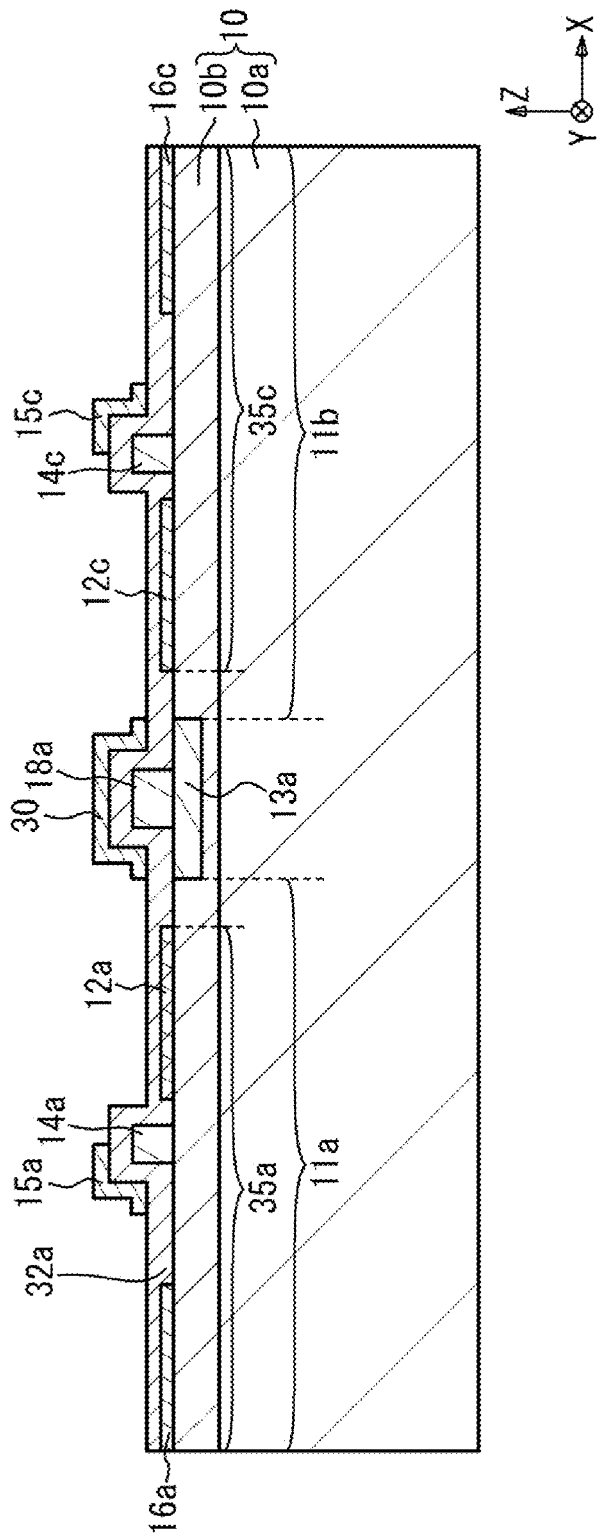
FIG. 13A is a cross-sectional view illustrating the method for manufacturing the semiconductor device according to the first embodiment.

As illustrated in FIGS. 9 and 13A, the field plates 15*a* and 15*c* and the cover metal layer 30 are formed on the insulating layer 32*a*. The field plates 15*a* and 15*c* and the cover metal layer 30 are formed by, for example, the vacuum evaporation method and the lift-off method. The + end of the cover metal layer 30 in the Y direction is in contact with the source electrode 12*b*.

Figure 10:
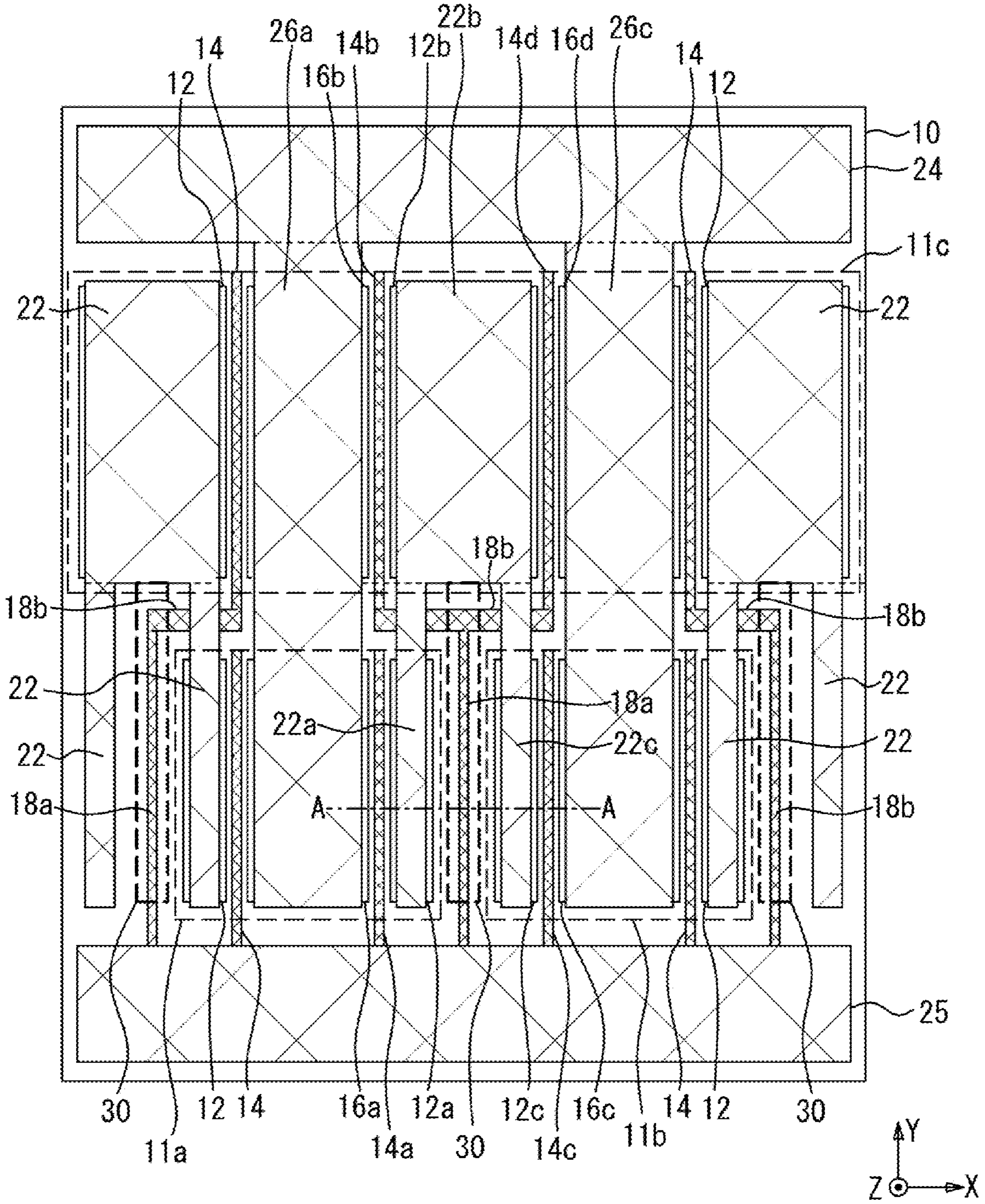
FIG. 10 is a plan view illustrating the method for manufacturing the semiconductor device according to the first embodiment.
Figure 13B:
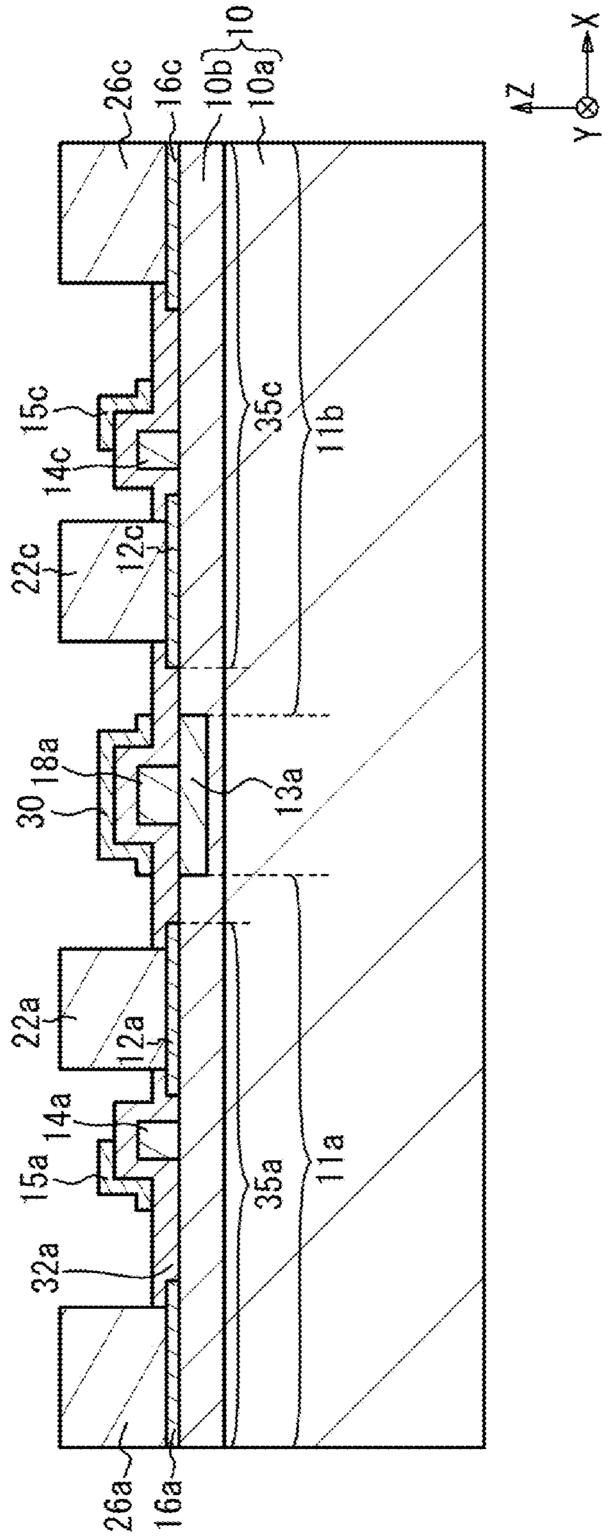
FIG. 13B is a cross-sectional view illustrating the method for manufacturing the semiconductor device according to the first embodiment.

As illustrated in FIGS. 10 and 13B, openings are formed in a desired region of the insulating layer 32*a* by an etching method. The source wirings 22*a* to 22*c* and the drain wirings 26*a* and 26*c* which are in contact with the source electrodes 12*a* to 12*c* and the drain electrodes 16*a* and 16*c*, respectively, are formed on the source electrodes 12*a* to 12*c* and the drain electrodes 16*a* and 16*c*, respectively. The gate bus bar 25 and the drain bus bar 24 are formed. The source wirings 22*a* to 22*c*, the gate bus bar 25, and the drain bus bar 24 are formed by, for example, a plating method.

Figure 14A:
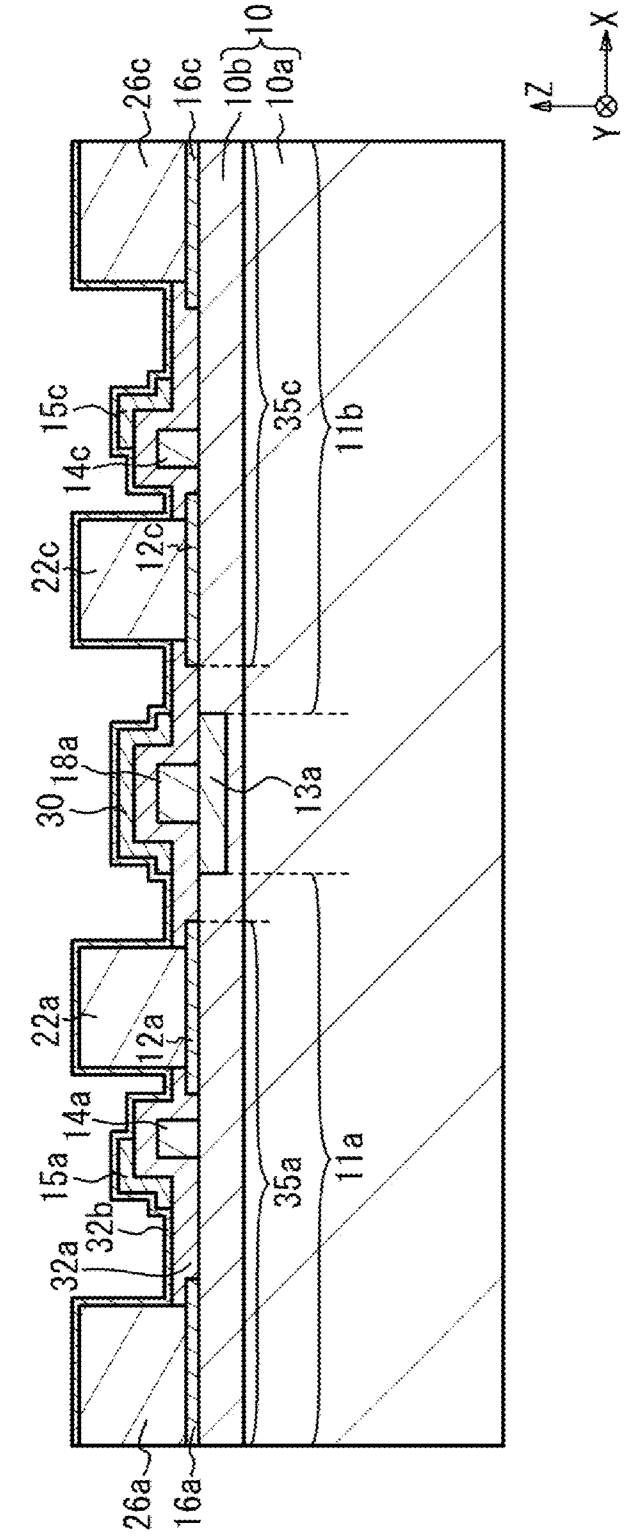
FIG. 14A is a cross-sectional view illustrating the method for manufacturing the semiconductor device according to the first embodiment.

As illustrated in FIG. 14A, the insulating layer 32*b* is formed so as to cover the field plates 15*a* and 15*c*, the source wirings 22*a* to 22*c*, the drain wirings 26*a* and 26*c*, and the cover metal layer 30. The insulating layer 32*b* is formed by, for example, the CVD method.

Figure 14B:
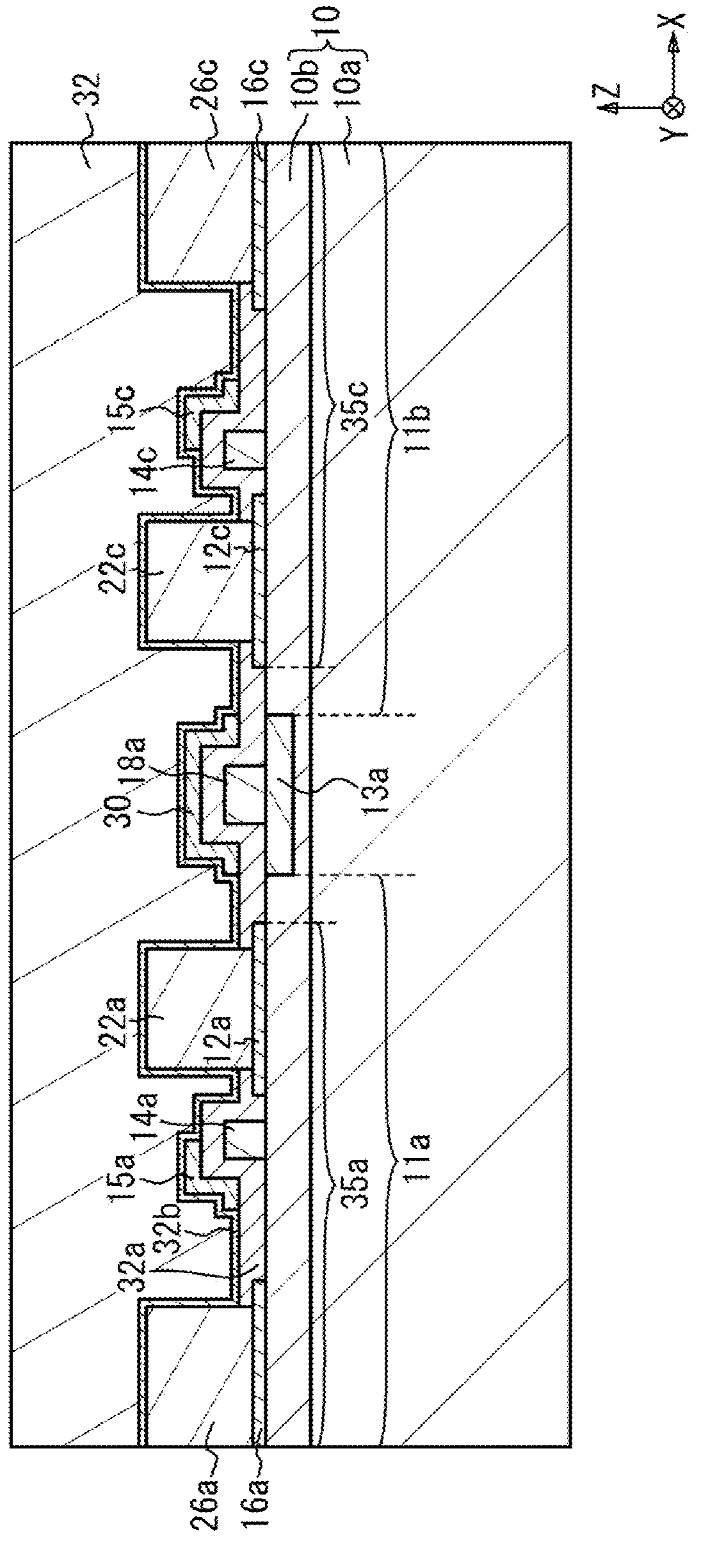
FIG. 14B is a cross-sectional view illustrating the method for manufacturing the semiconductor device according to the first embodiment.

As illustrated in FIG. 14B, the insulating layer 32 is formed on the insulating layer 32*b*. The insulating layer 32 is formed by applying a solvent containing a resin and performing heat treatment. Openings (not illustrated) are formed in the insulating layers 32 and 32*b* to expose the gate bus bar 25 and the drain bus bar 24.

Thereafter, the lower surface of the substrate 10 is thinned by polishing or grinding, and the via holes 20 penetrating the substrate 10 are formed. The metal layers 28 and 28*a* are formed on the lower surface of the substrate 10 and the inner surface of the via holes 20. Thus, the semiconductor device according to the first embodiment is manufactured.

First Comparative Example

Figure 15:
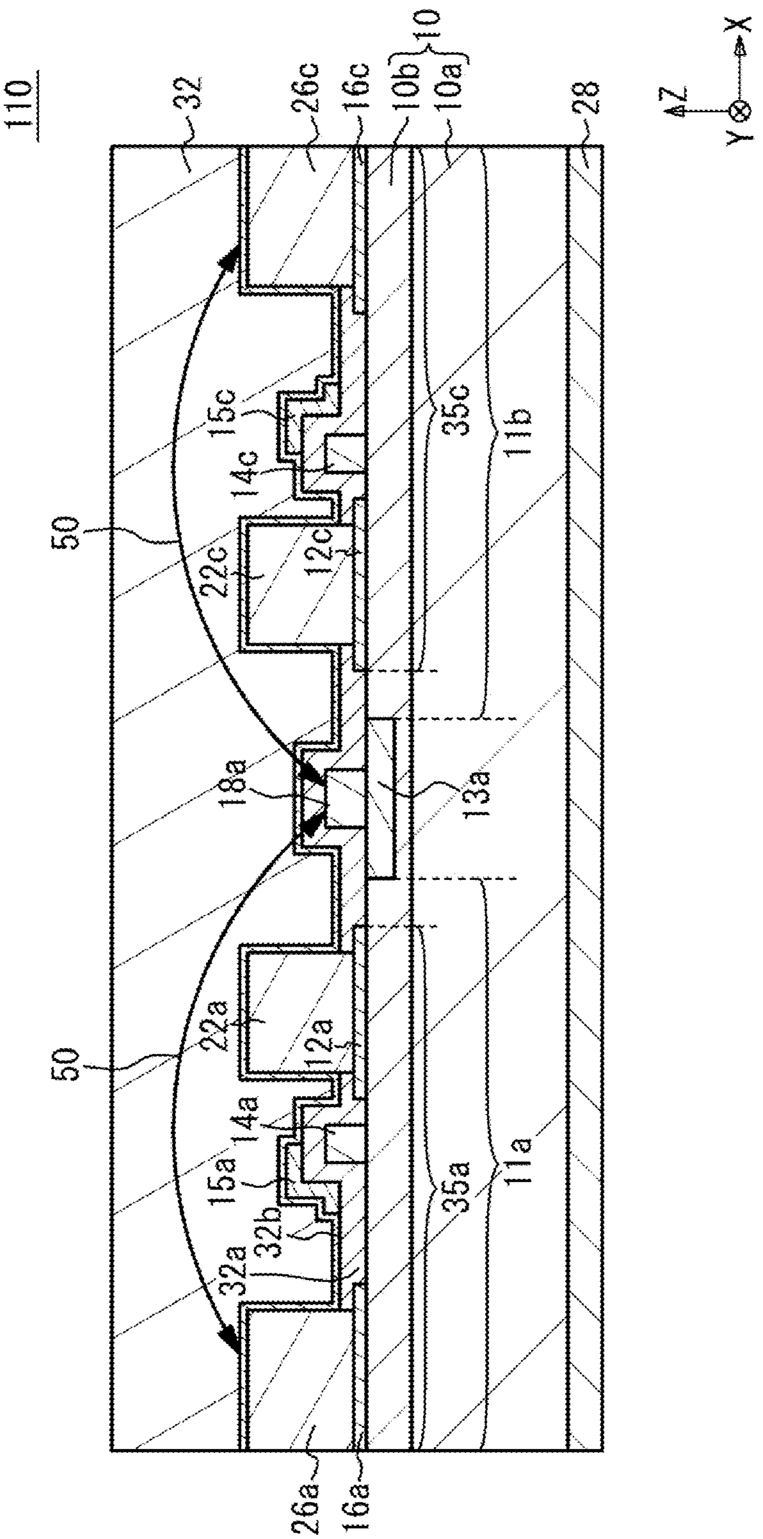
FIG. 15 is a cross-sectional view illustrating the method for manufacturing the semiconductor device according to a first comparative example.

FIG. 15 is a cross-sectional view of a semiconductor device according to a first comparative example. As illustrated in FIG. 12, a semiconductor device 110 of the first comparative example is not provided with the cover metal layer 30. The other configurations of the first comparative example are the same as those of the first embodiment.

The gate wiring 18*a* electrically connects gate electrodes 14*b* and 14*d* (see FIG. 2) to the gate bus bar 25. This makes it possible to lower the gate resistance of the unit FETs 35*b* and 35*d* (see FIG. 2). However, as indicated by solid line arrows 50, the gate wiring 18*a* and the drain wirings 26*a* and 26*c* are capacitively coupled by the lines of electric force passing over the source wirings 22*a* and 22*c*. This increases the gate-drain parasitic capacitance. As the gate-drain parasitic capacitance increases, the gain decreases. In addition, the K-factor, which is a stability coefficient, is lowered. In this way, the high frequency characteristics of the semiconductor device 110 deteriorate.

Description of First Embodiment

Figure 3:
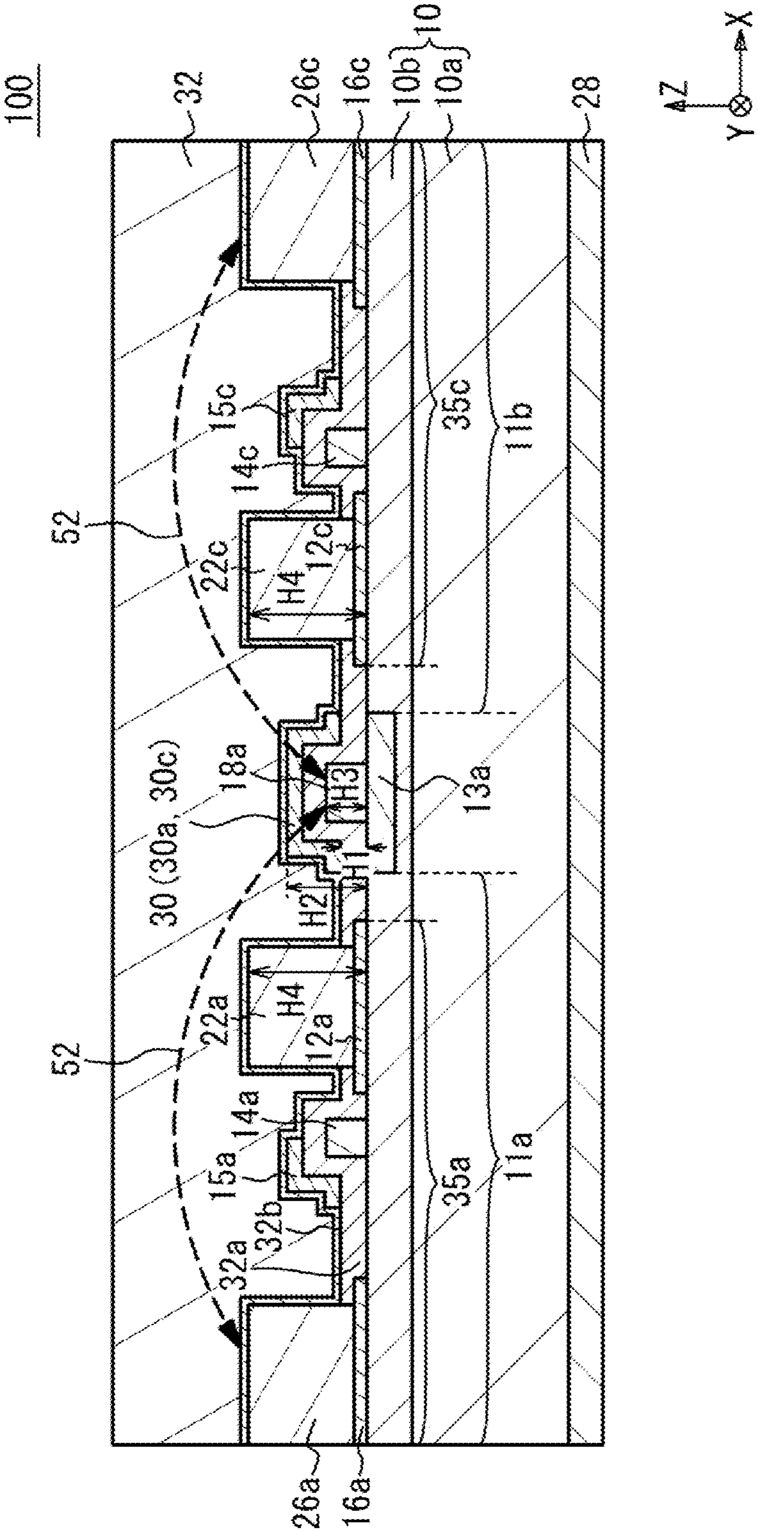
FIG. 3 is a cross-sectional view taken along a line A-A of FIGS. 1 and 2.

As illustrated in FIG. 3, according to the first embodiment, the cover metal layer 30 is provided above the gate wiring 18*a*. As a result, the cover metal layer 30 shields the lines of electric force between the gate wiring 18*a* and the drain wirings 26*a* and 26*c* as indicated by broken line arrows 52. This suppresses the capacitive coupling between the gate wiring 18*a* and the drain wirings 26*a* and 26*c*. Therefore, the gate-drain parasitic capacitance can be suppressed, and the deterioration of the high frequency characteristics of the semiconductor device 100 can be suppressed. In the first embodiment, the gate-source parasitic capacitance and the drain-source parasitic capacitance increase. However, the gate-source capacitance and the drain-source capacitance are larger than the gate-drain capacitance. Therefore, the influences of the gate-source parasitic capacitance and the drain-source parasitic capacitance are small.

Both ends of the cover metal layer 30 in the X direction are located outside the gate wiring 18*a* in the X direction when viewed from the Z direction. A height H1 of the lower surface of ends of the cover metal layer 30 in the X direction from the substrate 10 is smaller than a height H3 of the upper surface of the gate wiring 18*a* from the substrate 10. Thus, the cover metal layer 30 can more effectively shield the lines of electric force between the gate wiring 18*a* and the drain wirings 26*a* and 26*c*, and can more effectively suppress the capacitive coupling. From the viewpoint of the shielding effect, the height H1 can be equal to or less than ¾ of the height H3, or can be equal to or less than ½ of the height H3. From the viewpoint of suppressing the contact between the cover metal layer 30 and the substrate 10, the height H1 is equal to or more than 1/10 of the height H3.

A height H2 of the upper surface of the cover metal layer 30 from the substrate 10 is smaller than a height H4 of the upper surfaces of the source wirings 22*a* and 22*c* from the substrate 10. Accordingly, the source wirings 22*a* and 22*c* also shield the lines of electric force between the gate wiring 18*a* and the drain wirings 26*a* and 26*c*, and the capacitive coupling can be suppressed. From the viewpoint of the shielding effect, the height H2 can be equal to or less than ¾ of the height H4, or can be equal to or less than ½ of the height H4. The height H2 is equal to or more than 1/10 of the height H4.

Figure 4:
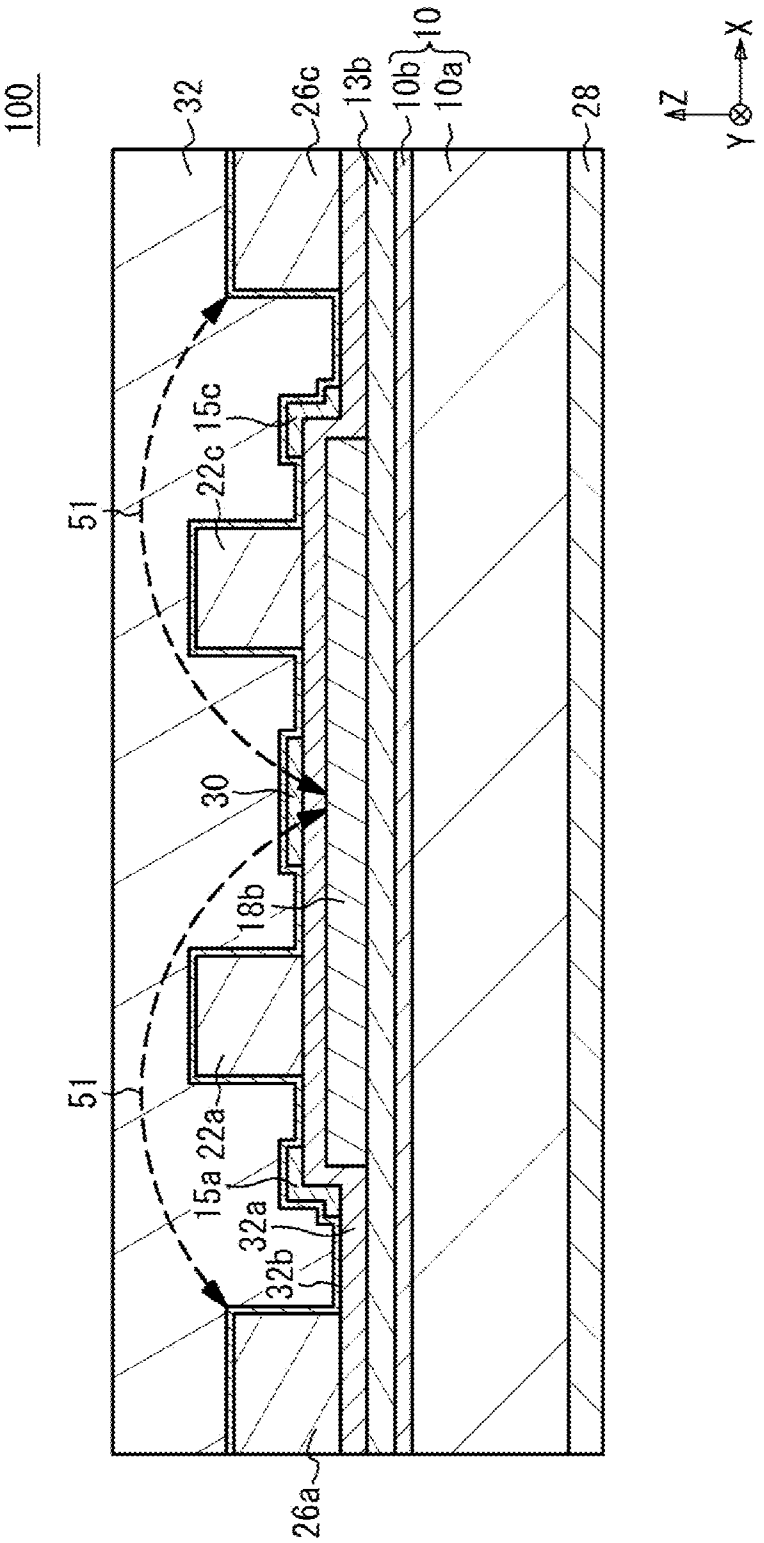
FIG. 4 is a cross-sectional view taken along a line B-B of FIGS. 1 and 2.

As illustrated in FIG. 4, in the inactive region 13*b*, the cover metal layer 30 is provided on the central portion of the gate wiring 18*b* in the X direction with the insulating layer 32*a* interposed therebetween. Thereby, the cover metal layer 30 shields the lines of electric force between a part of the gate wiring 18*b* and the drain wirings 26*a* and 26*c*, and suppresses the capacitive coupling, as indicated by broken line arrows 51. Therefore, the parasitic capacitance between the gate and the drain can be suppressed, and the deterioration of the high frequency characteristics of the semiconductor device 100 can be suppressed.

First Modification of First Embodiment

Figure 16:
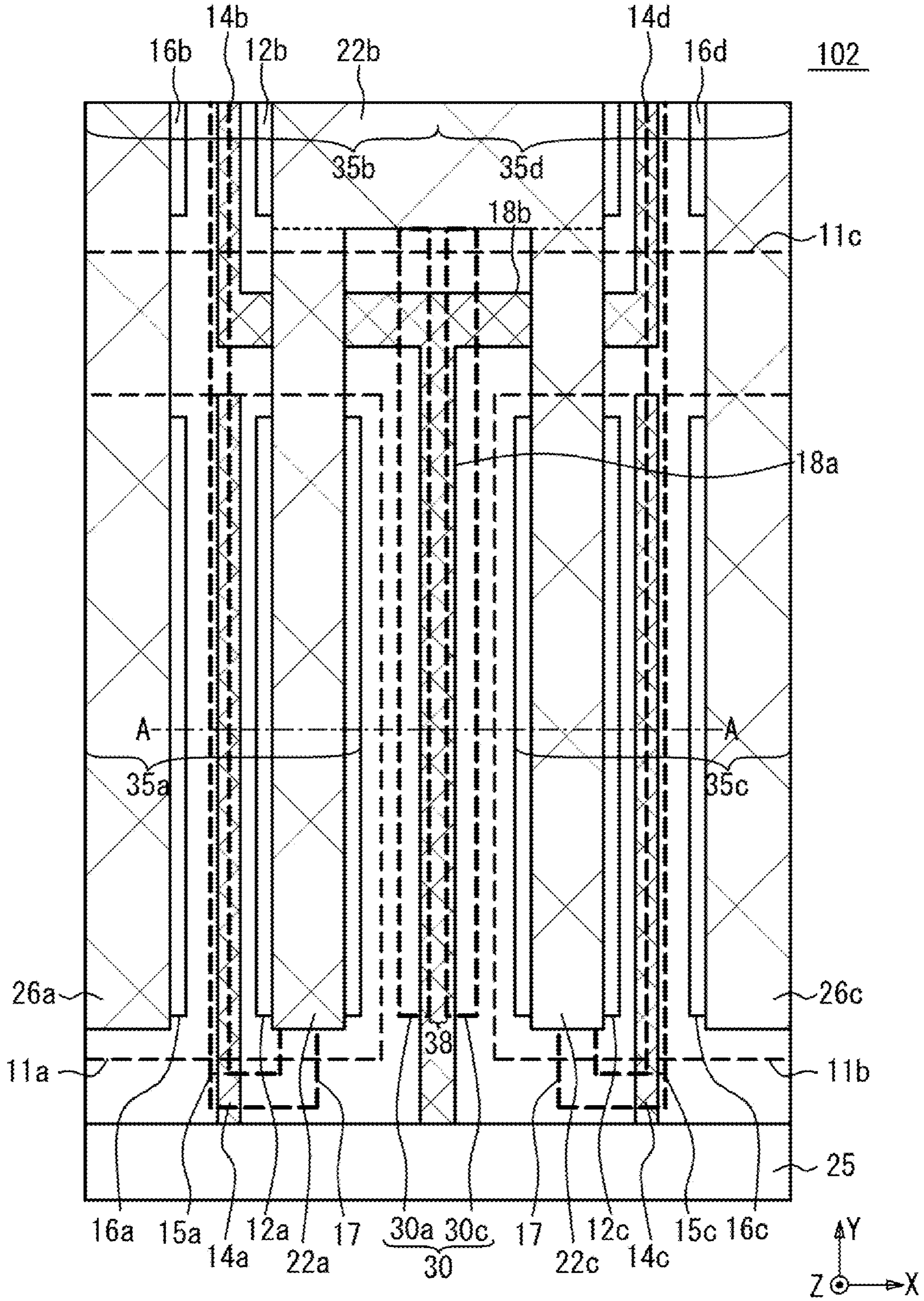
FIG. 16 is an enlarged plan view of a semiconductor device according to a first modification of the first embodiment.
Figure 17:
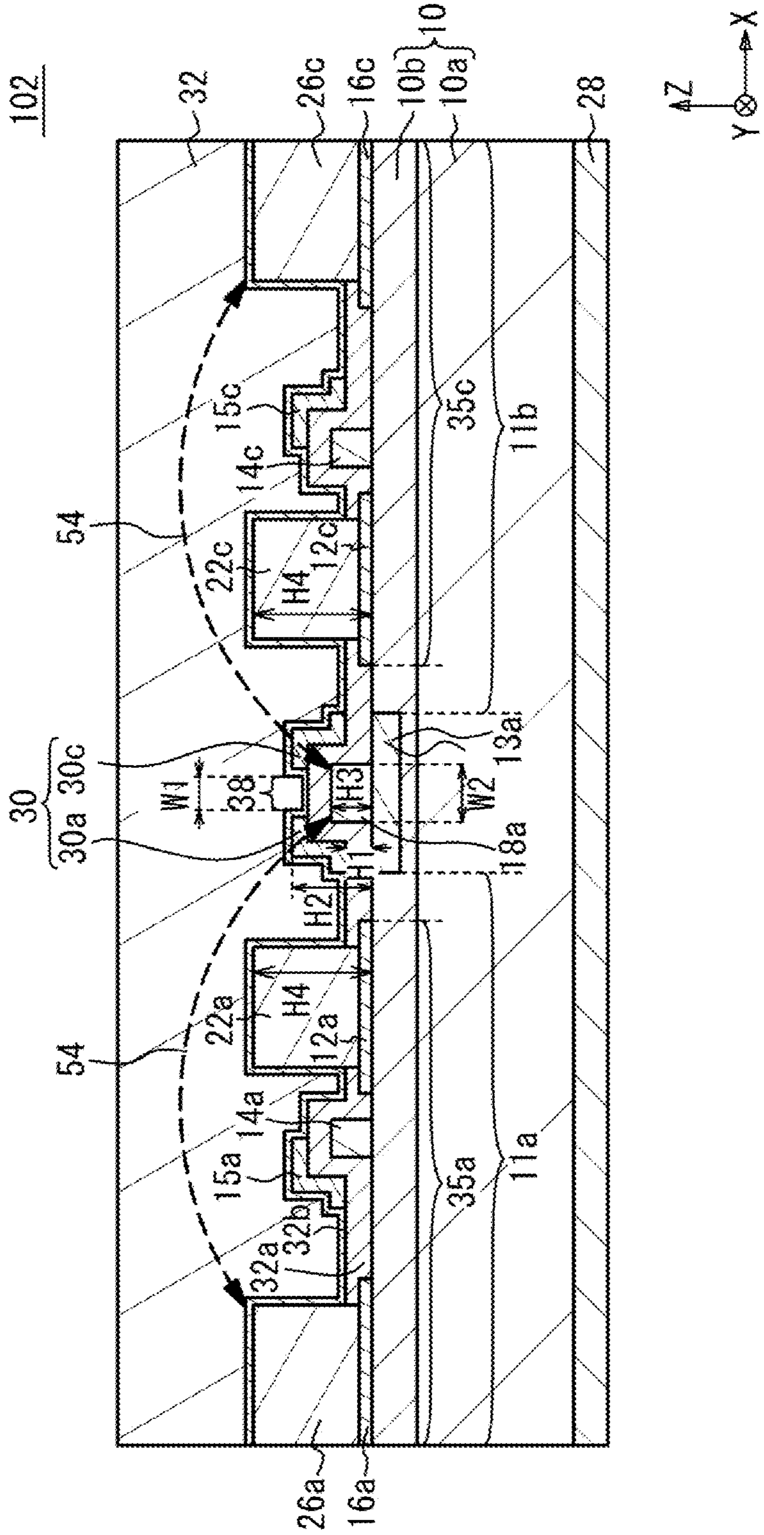
FIG. 17 is a cross-sectional view taken along a line A-A of FIG. 16.

FIG. 16 is an enlarged plan view of a semiconductor device according to a first modification of the first embodiment. FIG. 17 is a cross-sectional view taken along a line A-A in FIG. 16. As illustrated in FIGS. 16 and 17, in a semiconductor device 102 of the first modification of the first embodiment, the cover metal layer 30 has cover metal layers 30*a* and 30*c*. A gap 38 is provided between the cover metal layers 30*a* and 30*c*. When viewed from the Z direction, the + side surface of the cover metal layer 30*a* in the X direction overlaps with the gate wiring 18*a*, and the − side surface of the cover metal layer 30*c* in the X direction overlaps with the gate wiring 18*a*. The other configurations of the first modification of the first embodiment are the same as those of the first embodiment, and the description thereof is omitted.

As indicated by broken line arrows 54 in FIG. 17, most of the lines of electric force between the gate wiring 18*a* and the drain wirings 26*a* and 26*c* are shielded by the cover metal layer 30. Few lines of electric force pass through the gap 38. Therefore, the gate-drain parasitic capacitance can be suppressed. On the other hand, a part of the region of the cover metal layer 30 closest to the gate wiring 18*a* is the gap 38. This can suppress the gate-source parasitic capacitance.

A width W1 of the gap 38 in the X direction can be set appropriately depending on whether the gate-drain parasitic capacitance or the gate-source parasitic capacitance is considered important. When importance is attached to the suppression of the gate-drain parasitic capacitance, the width W1 can be 0.8 times or less, or 0.5 times or less a width W2 of the gate wiring 18*a* in the X direction. When importance is attached to the suppression of the gate-source parasitic capacitance, the width W1 can be 0.25 times or more, or 0.5 times or more the width W2.

Second Modification of First Embodiment

Figure 18:
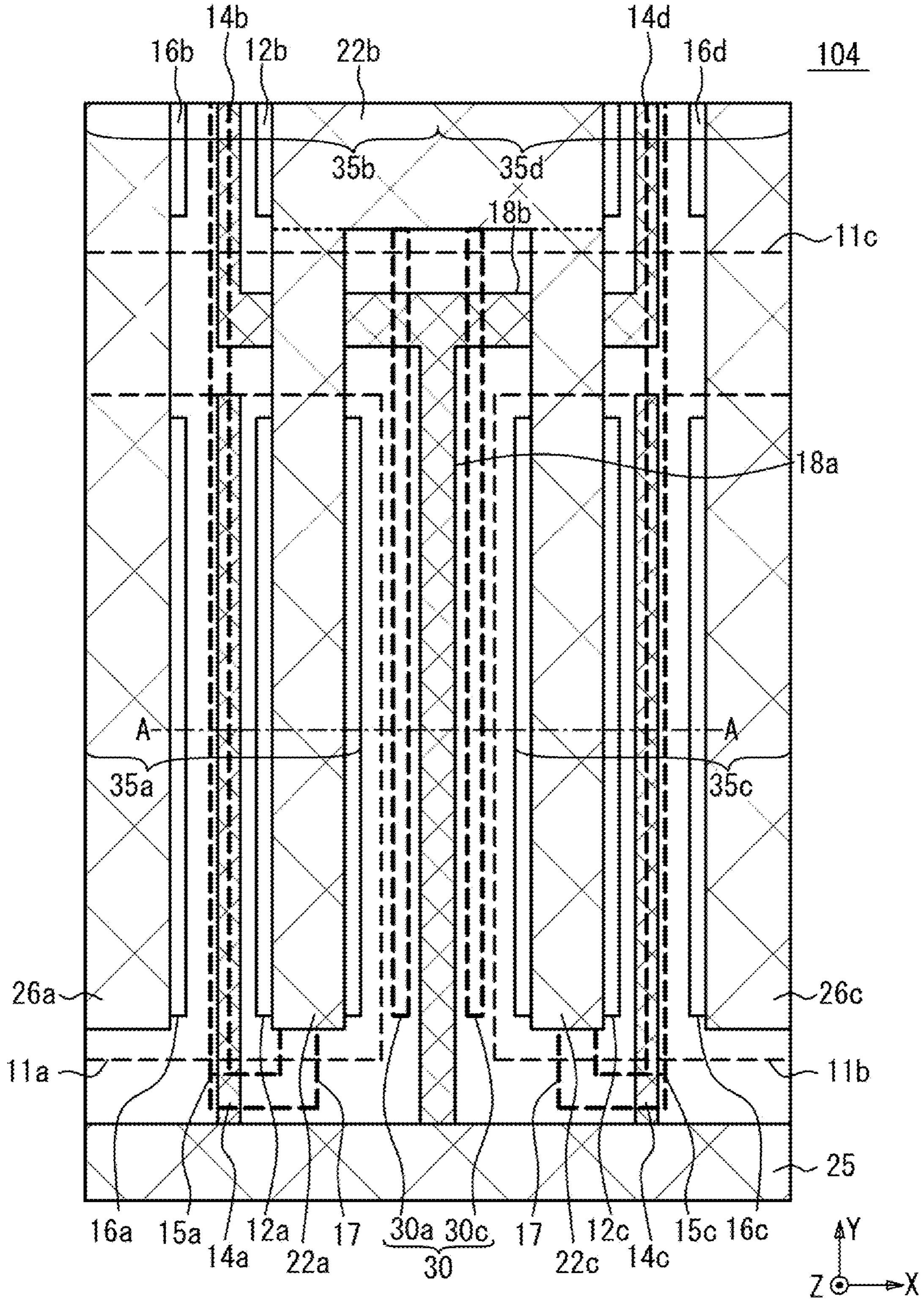
FIG. 18 is an enlarged plan view of a semiconductor device according to a second modification of the first embodiment.
Figure 19:
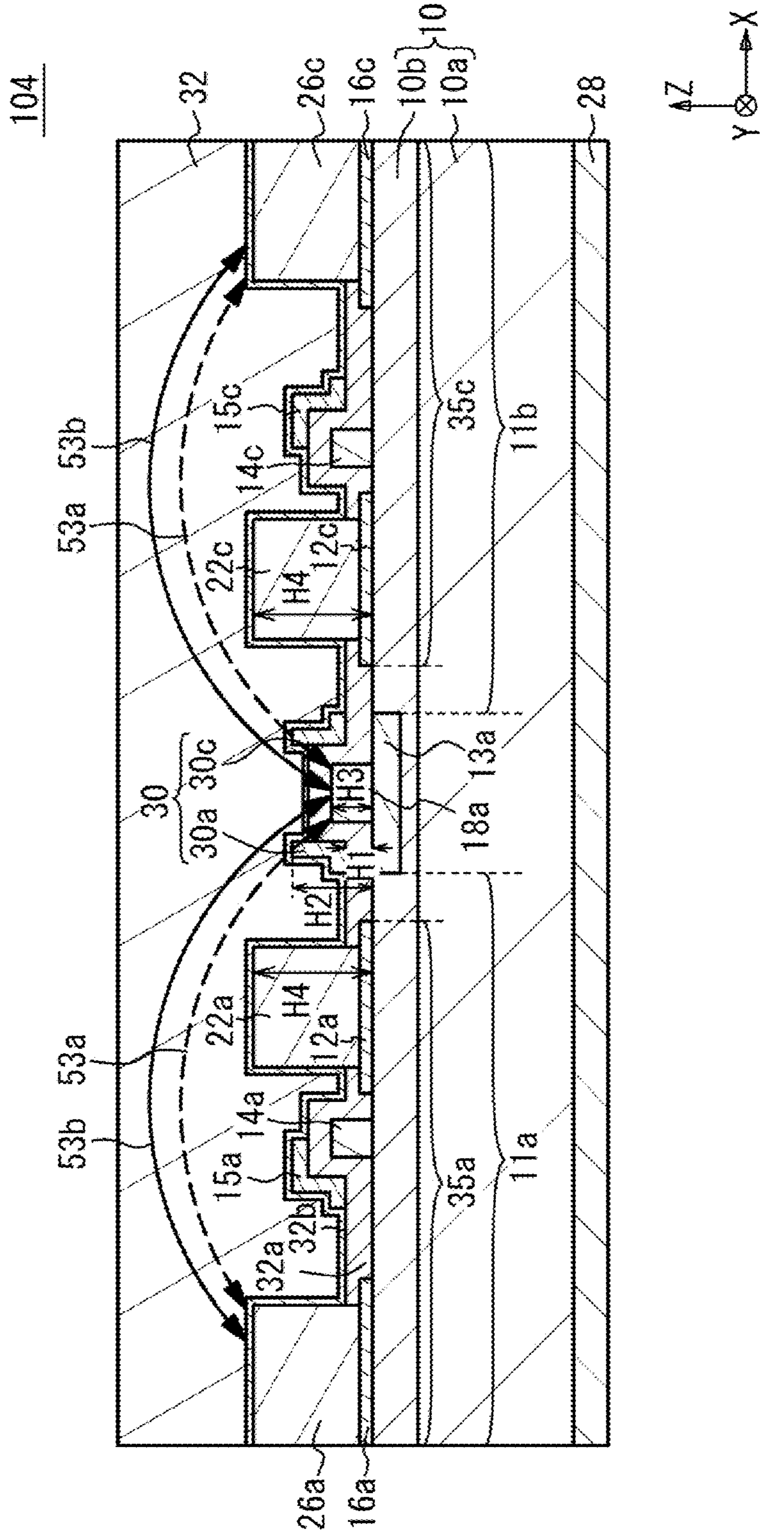
FIG. 19 is a cross-sectional view taken along a line A-A of FIG. 18.

FIG. 18 is an enlarged plan view of a semiconductor device according to a second modification of the first embodiment. FIG. 19 is a cross-sectional view taken along a line A-A in FIG. 18. As illustrated in FIGS. 18 and 19, in a semiconductor device 104 of the second modification of the first embodiment, the cover metal layer 30 has the cover metal layers 30*a* and 30*c*. The cover metal layers 30*a* and 30*c* do not overlap with the gate wiring 18*a* when viewed in the Z direction. The other configurations of the second modification of the first embodiment are the same as those of the first embodiment, and the description thereof is omitted.

As illustrated in FIG. 19, as indicated by broken line arrows 53*a*, the cover metal layers 30*a* and 30*c* suppress a part of the lines of electric force between the gate wiring 18*a* and the drain wiring 26*a* and 26*c*. As indicated by solid arrows 53*b*, a part of the lines of electric force between the gate wiring 18*a* and the drain wirings 26*a* and 26*c* is not shielded. This increases the gate-drain parasitic capacitance compared with the first embodiment and decreases the gate-source parasitic capacitance.

From the viewpoint of suppressing the gate-drain parasitic capacitance, the height H2 of the upper surfaces of the cover metal layers 30*a* and 30*c* from the upper surface of the substrate 10 can be made equal to or more than the height H3 of the upper surface of the gate wiring 18*a* from the upper surface of the substrate 10, and can be made equal to or more than 1.2 times or 1.5 times the height H3. The height H2 may be equal to or more than the height H4. From the viewpoint of the manufacturing process, the height H2 can be set to five times or less the height H3.

According to the first embodiment and the first and second modifications thereof, as illustrated in FIGS. 3, 17 and 19, the cover metal layer 30 or 30*a* (first cover metal layer) is provided above the substrate 10 between the source electrode 12*a* and the gate wiring 18*a* and adjacent to the source electrode 12*a* and the gate wiring 18*a*, and is electrically connected to the source electrode 12*a* through the source electrode 12*b* as illustrated in FIG. 2. Thus, the cover metal layer 30 or 30*a* suppresses the capacitive coupling between the gate wiring 18*a* and the drain wiring 26*a*. Therefore, the gate-drain parasitic capacitance can be suppressed, and the deterioration of the characteristics of the semiconductor device can be suppressed.

At least a part of the cover metal layer 30 overlaps with the gate wiring 18*a* in a non-contact manner when viewed from the Z direction. This makes it possible to further suppress the gate-drain parasitic capacitance and to further suppress the deterioration of the characteristics of the semiconductor device.

The cover metal layer 30 or 30*c* (second cover metal layer) is provided above the substrate 10 between the source electrode 12*c* and the gate wiring 18*a* and adjacent to the source electrode 12*c* and the gate wiring 18*a*, and is electrically connected to the source electrode 12*c* via the source electrode 12*b* as illustrated in FIG. 2. Thereby, the cover metal layer 30 or 30*c* suppresses the capacitive coupling between the gate wiring 18*a* and the drain wiring 26*c*. Therefore, the gate-drain parasitic capacitance can be further suppressed, and the deterioration of the characteristics of the semiconductor device can be further suppressed.

According to the first embodiment, as illustrated in FIG. 3, the cover metal layers 30*a* and 30*c* included in the cover metal layer 30 are in contact with each other above the gate wiring 18*a*. This makes it possible to further suppress the gate-drain parasitic capacitance and to further suppress the deterioration of the characteristics of the semiconductor device. When viewed in the X direction, the cover metal layers 30*a* and 30*c* are in contact with each other at all positions. This makes it possible to further suppress the gate-drain parasitic capacitance and to further suppress the deterioration of the characteristics of the semiconductor device.

As illustrated in FIGS. 17 and 19 of the first and second modifications of the first embodiment, the cover metal layers 30*a* and 30*c* is not in contact with each other above the gate wiring 18*a*. This makes it possible to suppress the gate-source parasitic capacitance and further suppress the deterioration of the characteristics of the semiconductor device.

The ends of the cover metal layers 30*a* and 30*c* in the X direction overlap with the gate wiring 18*a* when viewed from the Z direction. This makes it possible to suppress the gate-drain parasitic capacitance and the gate-source parasitic capacitance, and to further suppress the deterioration of the characteristics of the semiconductor device.

As illustrated in FIGS. 3, 17 and 19 of the first embodiment and the first and second modifications thereof, the height H2 of the upper surface of the cover metal layer 30 from the substrate 10 is larger than the height H3 of the upper surface of the gate wiring 18*a* from the substrate 10. The height H1 from the substrate 10 of the lower surface of the ends of the cover metal layer 30 located outside the gate wiring 18*a* in the X direction as viewed from the Z direction is smaller than the height H3 from the substrate 10 of the upper surface of the gate wiring 18*a*. As a result, the ends of the cover metal layer 30 outside the gate wiring 18*a* in the X direction cover a part of the sides of the gate wiring 18*a*. This suppresses the capacitive coupling between the gate wiring 18*a* and the drain wirings 26*a* and 26*c*. Therefore, the gate-drain parasitic capacitance can be further suppressed, and the deterioration of the characteristics of the semiconductor device can be further suppressed.

The height H2 of the upper surface of the cover metal layer 30 from the substrate 10 is smaller than the height H4 of the upper surfaces of the source wirings 22*a* and 22*c* from the substrate 10. This makes it possible to suppress the gate-drain parasitic capacitance and the gate-source parasitic capacitance, and to further suppress the deterioration of the characteristics of the semiconductor device.

As illustrated in FIGS. 9 and 13A, the cover metal layer 30 and the field plates 15*a* and 15*c* are formed simultaneously. This can reduce the number of manufacturing steps for forming the cover metal layer 30. The cover metal layer 30 and the field plates 15*a* and 15*c* are formed of the same material. The thickness of the cover metal layer 30 is equal to the thicknesses of the field plates 15*a* and 15*c*. At least a part of the field plates 15*a* and 15*c* may not be provided.

Second Embodiment

Figure 20:
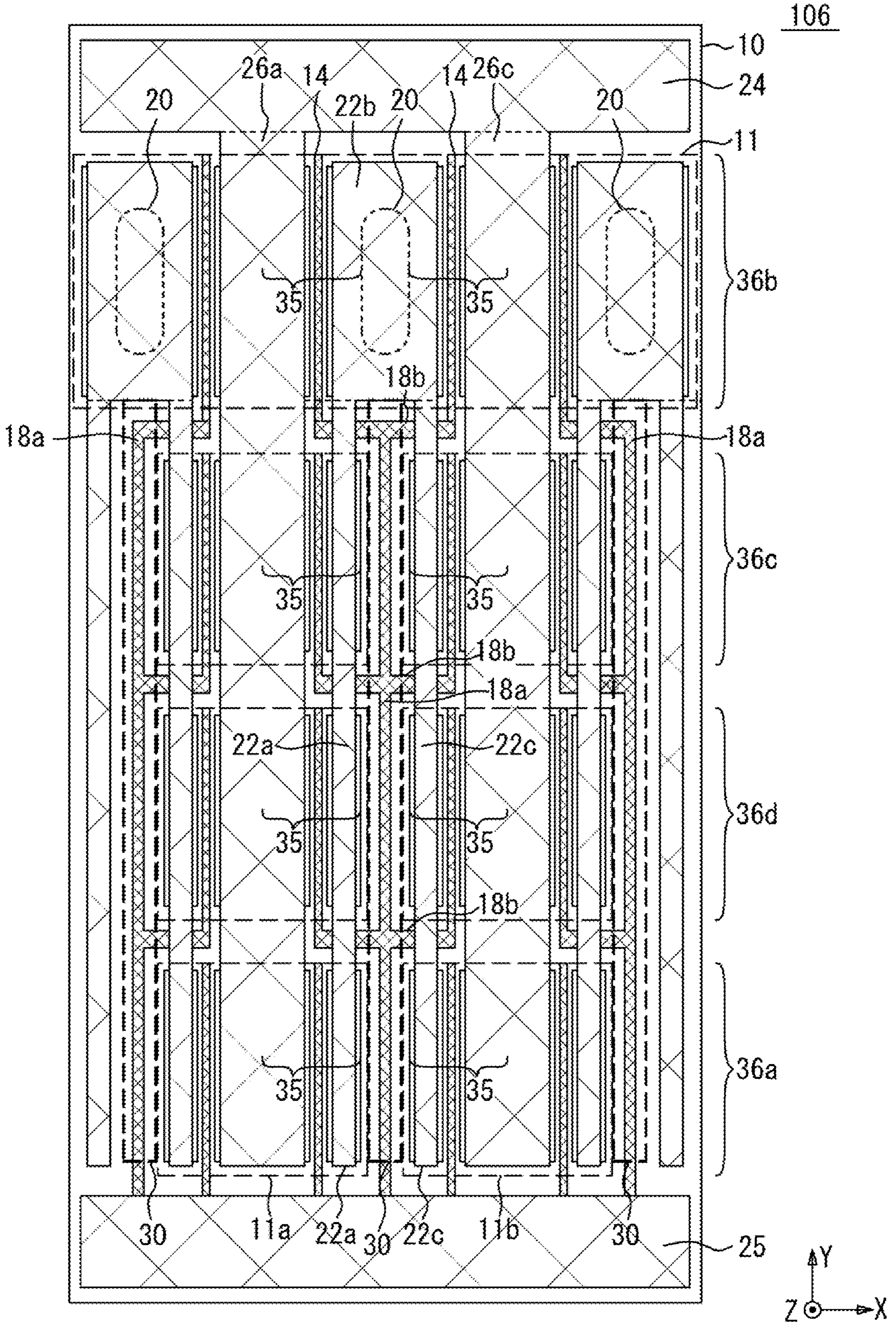
FIG. 20 is a plan view of a semiconductor device according to a second embodiment.

FIG. 20 is a plan view of a semiconductor device according to a second embodiment. As illustrated in FIG. 20, in a semiconductor device 106 of the second embodiment, FET groups 36*c* and 36*d* are provided between the FET groups 36*a* and 36*b*. The source wirings 22*a* and 22*c* are electrically connected to the source electrodes of the FET groups 36*a*, 36*c* and 36*d*. The drain wirings 26*a* and 26*c* are electrically connected to drain electrodes of the FET groups 36*a* to 36*d*. The gate wirings 18*a* and 18*b* are electrically connected to the gate electrodes 14 of the FET groups 36*b* to 36*d*. The cover metal layer 30 is provided in a region between the source wirings 22*a* and 22*c* of the FET groups 36*a*, 36*c* and 36*d*. The other configurations of the second embodiment are the same as those of the first embodiment, and the description thereof is omitted.

As in the second embodiment, the number of FET groups arranged in the Y direction may be four. In the first embodiment and the modification thereof, the number of FET groups arranged in the Y direction can be set as appropriate. Although the first and second embodiments and the modification thereof have been described with reference to the example in which the number of the unit FETs 35 in the X direction is four, the number of the unit FETs 35 in the X direction may be set to any one of one to three or five or more as appropriate.

[Measurement Result]

Figure 21:
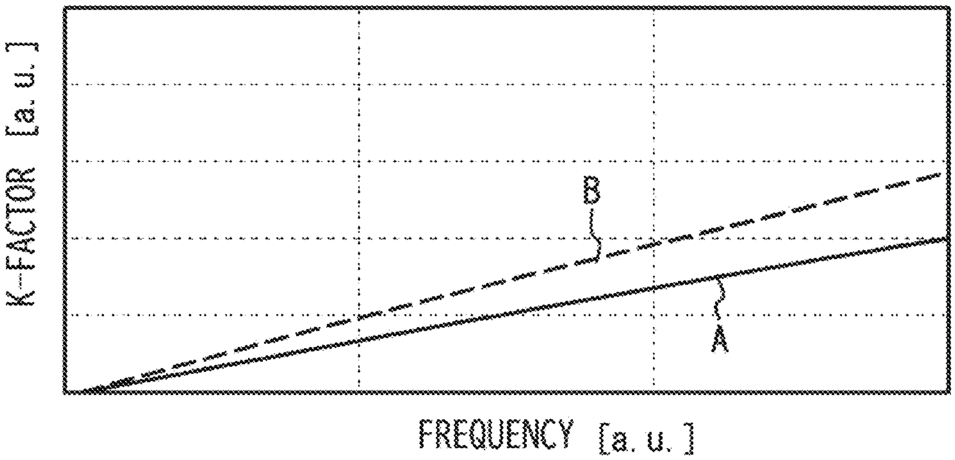
FIG. 21 is a diagram illustrating K-factor with respect to a frequency in semiconductor devices A and B.
Figure 22:
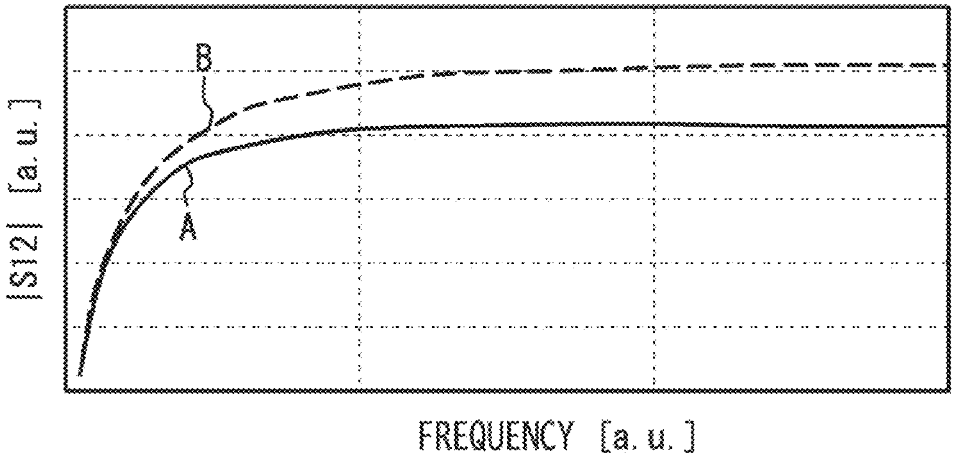
FIG. 22 is a diagram illustrating |S12| with respect to a frequency in the semiconductor devices A and B.

The GaN HEMTs having the structures of the first comparative example and the first embodiment were fabricated, and the high frequency characteristics thereof were measured. A high frequency signal is input to the gate bus bar 25, and an amplified high frequency signal is output from the drain bus bar 24. FIG. 21 is a diagram illustrating a K-factor with respect to a frequency in semiconductor devices A and B. FIG. 22 is a diagram illustrating |S12| with respect to a frequency in the semiconductor devices A and B. In FIG. 21, a horizontal axis represents the frequency, and a vertical axis represents the K-factor which is a stability coefficient. The smaller the K-factor, the less likely the oscillation occurs and the more stable the oscillation is. In FIG. 22, a horizontal axis represents the frequency, and a vertical axis represents the |S12|. The |S12| is an absolute value of S-parameter S12 when the gate is a port 1 and the drain is a port 2. The |S12| represents a power fed back from the drain to the gate. The semiconductor device A corresponds to the first embodiment, and the semiconductor device B corresponds to the first comparative example.

As illustrated in FIGS. 21 and 22, the K-factor and the |S12| increase as the frequency increases. The K-factor and the |S12| of the semiconductor device A are smaller than those of the semiconductor device B. The gate-drain capacitance is a feedback capacitance, and as the gate-drain capacitance increases, both the K-factor and the |S12| increase. The semiconductor device A can have a small gate-drain capacitance and can suppress the K-factor and the |S12|, with compared to the semiconductor device B.

The embodiments disclosed here should be considered illustrative in all respects and not restrictive. The present disclosure is not limited to the specific embodiments described above, but various variations and changes are possible within the scope of the gist of the present disclosure as described in the claims.

The embodiments disclosed here should be considered illustrative in all respects and not restrictive. The present disclosure is not limited to the specific embodiments described above, but various variations and changes are possible within the scope of the gist of the present disclosure as described in the claims.

What is claimed is:

1. A semiconductor device comprising:

a substrate;

a first transistor unit having a first drain electrode, a first gate electrode, and a first source electrode which are provided in order on the substrate;

a second transistor unit having a second source electrode arranged along the first source electrode and electrically connected to the first source electrode, a second gate electrode electrically connected to the first gate electrode, and a second drain electrode electrically connected to the first drain electrode, the second source electrode, the second gate electrode and the second drain electrode being provided in order on the substrate, the second transistor unit being located in a direction where the first drain electrode, the first gate electrode, and the first source electrode are arranged with respect to the first transistor unit;

a gate wiring provided on the substrate between the first source electrode and the second source electrode and electrically connected to the first gate electrode and the second gate electrode;

a first cover metal layer provided above the substrate between the first source electrode and the gate wiring and adjacent to the first source electrode and the gate wiring, and electrically connected to the first source electrode; and a second cover metal layer provided above the substrate between the second source electrode and the gate wiring and adjacent to the second source electrode and the gate wiring, and electrically connected to the second source electrode.

2. The semiconductor device according to claim 1, wherein at least a part of the first cover metal layer and at least a part of the second cover metal layer overlap with the gate wiring in a non-contact manner in plan view.

3. The semiconductor device according to claim 1, wherein the first cover metal layer and the second cover metal layer are in contact with each other above the gate wiring.

4. The semiconductor device according to claim 1, wherein the first cover metal layer and the second cover metal layer are not in contact with each other above the gate wiring.

5. The semiconductor device according to claim 4, wherein an end of the first cover metal layer overlaps with the gate wiring in plan view, and an end of the second cover metal layer overlaps with the gate wiring in the plan view.

6. The semiconductor device according to claim 1, wherein a height of an upper surface of the first cover metal layer from the substrate is larger than a height of an upper surface of the gate wiring from the substrate, and a height of a lower surface of the first cover metal layer located outside the gate wiring from the substrate is smaller than the height of the upper surface of the gate wiring from the substrate.

7. The semiconductor device according to claim 1, further comprising:

a source wiring provided on the first source electrode in electrical contact therewith;

wherein a height of an upper surface of the first cover metal layer from the substrate is smaller than a height of an upper surface of the source wiring from the substrate.

8. The semiconductor device according to claim 1, further comprising:

a field plate provided above the substrate between the first gate electrode and the first drain electrode, the field plate being formed of a same material as the first cover metal layer.

9. The semiconductor device according to claim 1, further comprising:

a third transistor unit having a third drain electrode electrically connected to the first drain electrode, a third gate electrode electrically connected to the gate wiring, and a third source electrode electrically connected to the first source electrode, the third drain electrode, the third gate electrode and the third source electrode being provided in order on the substrate, the third transistor unit being located in a direction where the first gate electrode extends with respect to the first transistor unit.

10. A method of manufacturing a semiconductor device comprising:

forming, on a substrate, a first transistor unit having a first drain electrode, a first gate electrode, and a first source electrode provided in order, and a second transistor unit having a second source electrode provided along the first source electrode and electrically connected to the first source electrode, a second gate electrode electrically connected to the first gate electrode, and a second drain electrode electrically connected to the first drain electrode, the second source electrode, the second gate electrode, and the second drain electrode being provided in order, the second transistor unit being located in a direction where the first drain electrode, the first gate electrode, and the first source electrode are arranged with respect to the first transistor unit;

forming a gate wiring on the substrate between the first source electrode and the second source electrode, the gate wiring being electrically connected to the first gate electrode and the second gate electrode; and simultaneously forming a first cover metal layer provided above the substrate between the first source electrode and the gate wiring and adjacent to the first source electrode and the gate wiring and electrically connected to the first source electrode, a second cover metal layer provided above the substrate between the second source electrode and the gate wiring and adjacent to the second source electrode and the gate wiring and electrically connected to the second source electrode, and a field plate provided above the substrate between the first gate electrode and the first drain electrode.

* * * * *